US012230181B2

(12) United States Patent
Ahmed et al.

(10) Patent No.: US 12,230,181 B2
(45) Date of Patent: Feb. 18, 2025

(54) REDUNDANT SUB-PIXELS IN A LIGHT-EMITTING DIODE DISPLAY

(71) Applicant: Intel Corporation, Santa Clara, CA (US)

(72) Inventors: Khaled Ahmed, San Jose, CA (US); Vishal Ravindra Sinha, Portland, OR (US); Marko Bartscherer, Fairview, OR (US)

(73) Assignee: Intel Corporation, Santa Clara, CA (US)

( * ) Notice: Subject to any disclaimer, the term of this patent is extended or adjusted under 35 U.S.C. 154(b) by 897 days.

(21) Appl. No.: 16/914,309

(22) Filed: Jun. 27, 2020

(65) Prior Publication Data

US 2020/0327843 A1 Oct. 15, 2020

(51) Int. Cl.
G09G 3/20 (2006.01)
G09G 3/32 (2016.01)
H01L 25/075 (2006.01)
H10K 59/35 (2023.01)
H10K 59/90 (2023.01)

(52) U.S. Cl.
CPC ............ G09G 3/2003 (2013.01); G09G 3/32 (2013.01); G09G 2300/0443 (2013.01); G09G 2320/046 (2013.01); G09G 2320/064 (2013.01); H01L 25/0753 (2013.01); H10K 59/35 (2023.02); H10K 59/90 (2023.02)

(58) Field of Classification Search
CPC ... G09G 2300/0443; G09G 2300/0804; G09G 2300/0819; G09G 2300/0842; G09G 2300/0852; G09G 2300/0861; G09G 2310/0297; G09G 2320/045; G09G 2320/046; G09G 2320/064; G09G 2330/08; G09G 3/2003; G09G 3/32; G09G 3/3233; H01L 25/0753; H10K 59/12; H10K 59/35; H10K 59/90
See application file for complete search history.

(56) References Cited

U.S. PATENT DOCUMENTS

| | | |
|---|---|---|
| 10,157,897 B1 | 12/2018 | Smith et al. |
| 10,361,353 B2 | 7/2019 | George et al. |
| 10,372,196 B2 | 8/2019 | Chauhan et al. |
| 10,386,568 B2 | 8/2019 | Sundaram |
| 10,475,912 B2 | 11/2019 | Thomas et al. |
| 10,490,727 B2 | 11/2019 | Thomas et al. |
| 10,565,515 B2 | 2/2020 | Lampert et al. |
| 10,593,756 B2 | 3/2020 | Pillarisetty et al. |
| 10,615,160 B2 | 4/2020 | Roberts et al. |
| 10,635,990 B1 | 4/2020 | Park et al. |
| 10,644,113 B2 | 5/2020 | Clarke et al. |

(Continued)

FOREIGN PATENT DOCUMENTS

CN 103676253 A * 3/2014 ............. G06T 1/00

*Primary Examiner* — Kenneth Bukowski
(74) *Attorney, Agent, or Firm* — Alliance IP, LLC

(57) ABSTRACT

A display device includes light-emitting diode (LED) devices to implement an array of pixels, where pixels in the array are each associated with a respective first set of LED devices to implement a first set of sub-pixels and a respective second set of LED devices to implement a redundant second set of sub-pixels for the corresponding pixel. Controller circuitry is provided to alternatively enable the first set of LED devices or the second set of LED device to implement the sub-pixels of the corresponding pixel.

18 Claims, 15 Drawing Sheets

(56) References Cited

U.S. PATENT DOCUMENTS

| | | | |
|---|---|---|---|
| 10,665,770 B2 | 5/2020 | Pillarisetty et al. | |
| 10,714,604 B2 | 7/2020 | George et al. | |
| 10,734,482 B2 | 8/2020 | Roberts et al. | |
| 10,741,664 B2 | 8/2020 | Pillarisetty et al. | |
| 10,756,202 B2 | 8/2020 | Roberts et al. | |
| 10,763,347 B2 | 9/2020 | Amin et al. | |
| 10,763,349 B2 | 9/2020 | Pillarisetty et al. | |
| 10,770,545 B2 | 9/2020 | George et al. | |
| 2006/0087478 A1* | 4/2006 | Eom | G09G 3/3266 345/45 |
| 2018/0373092 A1 | 12/2018 | Eley et al. | |
| 2019/0042968 A1 | 2/2019 | Lampert et al. | |
| 2019/0043950 A1 | 2/2019 | George et al. | |
| 2019/0043951 A1 | 2/2019 | Thomas et al. | |
| 2019/0043952 A1 | 2/2019 | Thomas et al. | |
| 2019/0043953 A1 | 2/2019 | George et al. | |
| 2019/0043955 A1 | 2/2019 | George et al. | |
| 2019/0043973 A1 | 2/2019 | George et al. | |
| 2019/0043974 A1 | 2/2019 | Thomas et al. | |
| 2019/0043975 A1 | 2/2019 | George et al. | |
| 2019/0043989 A1 | 2/2019 | Thomas et al. | |
| 2019/0044048 A1 | 2/2019 | George et al. | |
| 2019/0044049 A1 | 2/2019 | Thomas et al. | |
| 2019/0044050 A1 | 2/2019 | Pillarisetty et al. | |
| 2019/0049781 A1 | 2/2019 | Jiang et al. | |
| 2019/0140073 A1 | 5/2019 | Pillarisetty et al. | |
| 2019/0148530 A1 | 5/2019 | Pillarisetty et al. | |
| 2019/0157393 A1 | 5/2019 | Roberts et al. | |
| 2019/0164959 A1 | 5/2019 | Thomas et al. | |
| 2019/0165152 A1 | 5/2019 | Roberts et al. | |
| 2019/0172385 A1* | 6/2019 | Mori | G09G 3/2074 |
| 2019/0194016 A1 | 6/2019 | Roberts et al. | |
| 2019/0198618 A1 | 6/2019 | George et al. | |
| 2019/0206991 A1 | 7/2019 | Pillarisetty et al. | |
| 2019/0206992 A1 | 7/2019 | George et al. | |
| 2019/0206993 A1 | 7/2019 | Pillarisetty et al. | |
| 2019/0214385 A1 | 7/2019 | Roberts et al. | |
| 2019/0229188 A1 | 7/2019 | Clarke et al. | |
| 2019/0229189 A1 | 7/2019 | Clarke et al. | |
| 2019/0252377 A1 | 8/2019 | Clarke et al. | |
| 2019/0252536 A1 | 8/2019 | George et al. | |
| 2019/0259850 A1 | 8/2019 | Pillarisetty et al. | |
| 2019/0266511 A1 | 8/2019 | Pillarisetty et al. | |
| 2019/0312128 A1 | 10/2019 | Roberts et al. | |
| 2019/0334020 A1 | 10/2019 | Amin et al. | |
| 2019/0341459 A1 | 11/2019 | Pillarisetty et al. | |
| 2019/0363181 A1 | 11/2019 | Pillarisetty et al. | |
| 2019/0371244 A1* | 12/2019 | Peng | G09G 3/3258 |
| 2019/0392352 A1 | 12/2019 | Lampert et al. | |
| 2020/0052033 A1* | 2/2020 | Iguchi | H01L 27/156 |
| 2020/0075473 A1 | 3/2020 | Pietambaram et al. | |
| 2020/0119169 A1 | 4/2020 | Pillarisetty et al. | |
| 2020/0119253 A1 | 4/2020 | Roberts et al. | |
| 2020/0135864 A1 | 4/2020 | Singh et al. | |
| 2020/0144400 A1 | 5/2020 | George et al. | |
| 2020/0161455 A1 | 5/2020 | Singh et al. | |
| 2020/0176569 A1 | 6/2020 | Singh et al. | |
| 2020/0203593 A1 | 6/2020 | Roberts et al. | |
| 2020/0212210 A1 | 7/2020 | Pillarisetty et al. | |
| 2020/0252133 A1 | 8/2020 | Hong et al. | |
| 2020/0258984 A1 | 8/2020 | George et al. | |
| 2020/0279937 A1 | 9/2020 | Pillarisetty et al. | |
| 2020/0295164 A1 | 9/2020 | Singh et al. | |
| 2021/0118366 A1* | 4/2021 | Xuan | G09G 3/3266 |

* cited by examiner

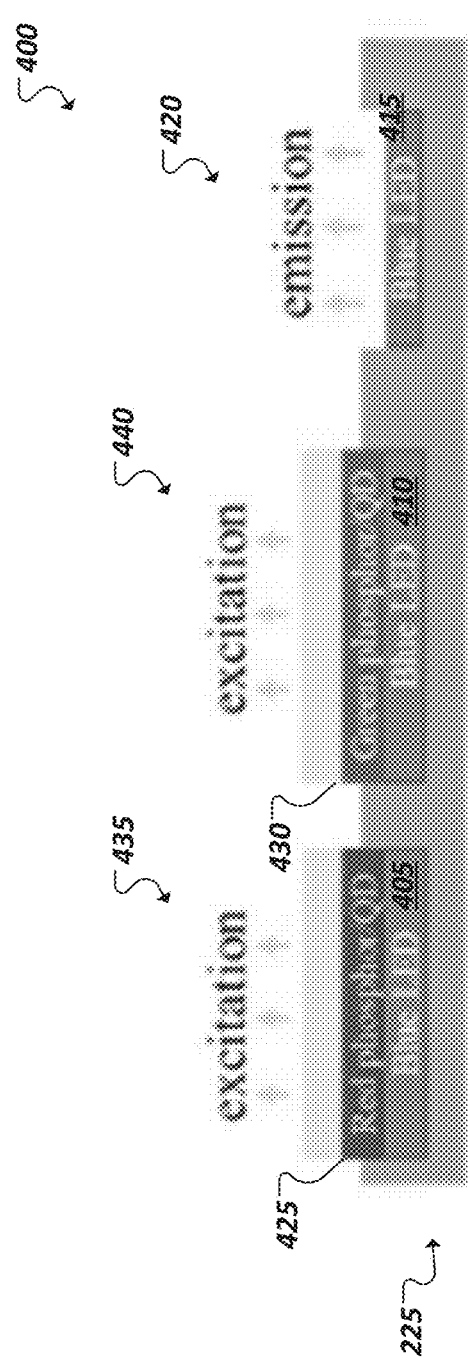

REDUNDANT SUB-PIXELS IN A LIGHT-EMITTING DIODE DISPLAY

TECHNICAL FIELD

This disclosure relates in general to the field of computer systems and, more particularly, to light-emitting diodes (LEDs) and microLED devices.

BACKGROUND

A light emitting diode (LED) is a two-lead semiconductor light source. More simply, LEDs are essentially p-n junction diodes that emit light when activated. This effect is called electroluminescence, and the color of the light emitted is determined by the energy band gap of the semiconductor material. Traditional LEDs are typically of a size on the order of hundreds of microns. In contrast, micro-sized LEDs (or microLEDs) are of a size on the order of tens of microns or less. Micro LED displays can provide brighter screens and wider color ranges than that achievable using traditional LED or organic LED (OLED) displays. Micro LEDs are an emerging technology area, and demand for micro LED-based technology platforms in devices such as consumer wearables (for example, watches, augmented reality devices, virtual reality devices) and mobile or stationary display devices is increasing rapidly. Such devices may require a full color range, high brightness (for example, more than 2,000 $cd/m^2$), high contrast, low power requirements, high pixel densities (for example, more than 2,500 pixels per inch), and low manufacturing costs. To make active matrix micro LED display panels capable of satisfying these requirements, many workflows produce individual micro LEDs that are tuned to emit red, green or blue colors on separate wafers. These micro LEDs are then transferred from the original wafers to thin film transistor (TFT) backplanes to make red, green, and blue (RGB) pixels that make up the active matrix LED display panel. In other words, conventional micro LEDs may be made up of micron sized digital components formed on appropriate substrates, separated from those substrates, and then placed together on one new substrate.

BRIEF DESCRIPTION OF THE DRAWINGS

FIG. 4 is a simplified block diagram illustrating an example LED device utilizing quantum dot color conversion.

Like reference numbers and designations in the various drawings indicate like elements.

DETAILED DESCRIPTION OF EXAMPLE EMBODIMENTS

Figure 1A:
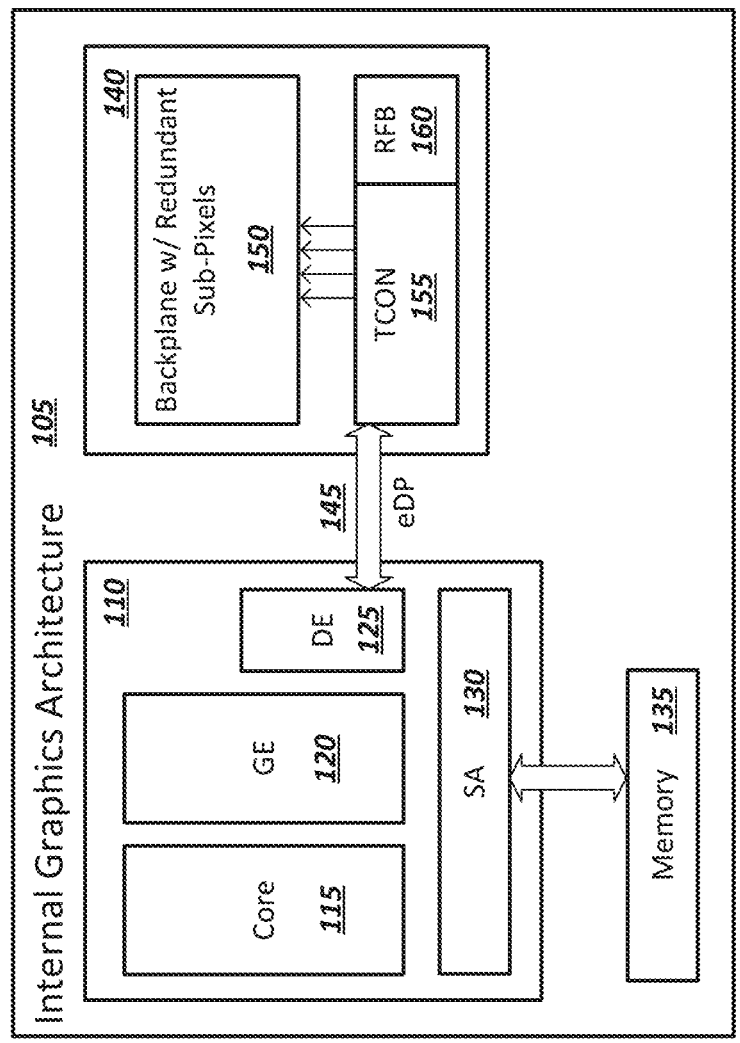
FIGS. 1A-1B are simplified block diagrams illustrating example computer display architectures.

Some personal computing devices with digital displays, such as notebooks, personal computer displays, tablets, and other devices, have relatively high life spans, with users keeping and regularly using such devices for 3-5 years or longer. Additionally, where a device is used for a particular purpose, the images and test displayed may tend to repeatedly occupy certain locations of the display device, which may result in burn-in and other degradation of the display over time. This disclosure introduces an improved display device, which utilizes redundant sub-pixels which may be controlled to be used in a rotating basis to address these and other issues, among other example features and advantages.

Emerging micro display technologies utilize microscopic implementations of light emitting diodes (LEDs) (e.g., micro LEDs, micro OLEDs, micro QLEDs, etc.) to form individual pixel elements within a display. Indeed, an array of such LEDs may be provided to implement a digital display. MicroLED technology, for instance, may provide higher total brightness and high contrast ratio, while at the same time offering higher efficiency and power consumption that other, conventional LED technologies (e.g., organic LED (OLED), and greatly reduced energy consumption over conventional liquid crystal display (LCD) technologies, among other example advantages.

In the case of microLEDs, gallium nitride (GaN)-based LED elements may be implemented which, in some cases, are LEDs with dimensions smaller than 100 µm. When illuminated a micro LED device may present a pixel with an effective width many times wider than the dimensions of the micro LED itself. In some implementations, displays may be constructed from an array of microLED elements to realize a particular display resolution, where the pixel pitch and corresponding distance between LED elements results in untapped real estate (e.g., on the backplane or semiconductor substrate holding the LED elements) on a per pixel basis (e.g., the unused silicon area between neighboring microLEDs and the pixels they implement). The efficiency and miniature size of microLEDs realize such "extra" space on the backplane, which was not the case (nor possible) in traditional display technologies (e.g., including mini LED technology). In some implementations, this unused real estate may be utilized to enhance a microLED-based display, for instance, by using this area to pack multiple, redundant sub-pixel elements to implement each single pixel in the display, as well as implement additional controls, circuitry, or other compute elements to enable the use of such redundant sub-pixels, among other examples.

Some generations of micro LED displays include quantum dot color conversion to implement at least some of the colors of the display (e.g., for red colored subpixels). The brightness of quantum dots-based displays is limited by their lifetime, which gets shorter at higher brightness. For instance, the quantum dots color conversion films in red emitters are exposed to very high brightness during pulse width modulation driving of the underlying blue micro LEDs, which is necessary to reduce power consumption. This compromises the lifetime and high brightness of micro LED displays that use quantum dot color conversion for red (or green) emitter. Accordingly, micro LED displays that utilize quantum dot color conversion may be particular susceptible to burn-in and other display degradation problems, among other example issues. Indeed, for device applications requiring high brightness micro LED displays, enhanced solutions may be applied to extend the lifetime of the display (e.g., by 2×) before a consumer can see burin-in issue and has to replace the device.

Some generations of micro LED displays include quantum dot color conversion to implement at least some of the colors of the display (e.g., for red colored subpixels). The brightness of quantum dots-based displays is limited by their lifetime, which gets shorter at higher brightness. For instance, the quantum dots color conversion films in red emitters are exposed to very high brightness during pulse width modulation driving of the underlying blue micro LEDs, which is necessary to reduce power consumption. This compromises the lifetime and high brightness of micro LED displays that use quantum dot color conversion for red (or green) emitter. Accordingly, micro LED displays that utilize quantum dot color conversion may be particular susceptible to burn-in and other display degradation problems, among other example issues. Indeed, for device applications requiring high brightness micro LED displays, enhanced solutions may be applied to extend the lifetime of the display (e.g., by 2×) before a consumer can see burin-in issue and has to replace the device.

Some systems may utilize technologies, which at least theoretically, may assist with preserving the life of display devices. Such traditional solutions are not without their deficiencies however. For instance, some display technologies utilize alternative sub-pixel arrangement patterns (e.g., an RG-BG sub-pixel pattern rather than a traditional RGB subpixel pattern), complex compensating circuits, or pixel shifting. Such traditional solutions, however, may have high power consumption due to dynamic compensation of degradation, limited freedom to operate for suppliers other than the developer of the proprietary solution, short product lifetimes, and relatively limited benefits in improving brightness and/or lifetime of the display. For instance, alternative sub-pixel patterns in OLED displays may only improve lifetime or brightness incrementally, whereas more pronounced lifetime extension (e.g. 2-3 times) is the goal. Solutions that use very complex compensating circuits and algorithms may cause high compute power consumption. Pixel shifting has been offered as a solution, where the display can display an image using a group of pixels. The display can implement a pixel shifting scheme. This pixel shifting scheme can move the display position of the image along an orbit. The orbit can be intended to shift the pixels used to the display the image in all directions. By moving the display position of the image, the pixel shifting scheme aims to distribute pixel usage to an extended area outside of the original display area. Further, this pixel shifting scheme can be a universal pixel shifting scheme as it can be applied to all areas of the display screen, implying that each pixel has equal chance of coverage as a result of the shift. In some examples, historical data for content that has been displayed on OLED or QD-based screen or display is maintained or tracked. As an example, historical data for content that has been displayed by the OLED displays can be maintained in a device driver of a graphics processing unit (GPU) (e.g., in a notebook computer) and/or in a memory. This pixel usage history could be maintained directly by an Operating System (OS), or through extension middleware or applications provided by independent software vendors. The historical data for content that has been displayed by the OLED or QD-based displays can be exploited or used by a pixel history generation (PHG) algorithm. The PHG algorithm can analyze the tracked historical data to generate or update a damage signature (DS) that is representative of the damage that has be incurred by the OLED or QD-based display. The PHG can make this damage signature available to the entity (e.g., notebook computer or handheld computer) implementing the history-aware pixel shifting algorithm.

An improved computer display system may utilize multiple, redundant sub-pixels (e.g., in a micro LED display) controlled by graphics circuitry to rotate use of these redundant sub-pixels and address at least some at least some of the issues identified above. For instance, redundant subpixels and associated driving circuitry may be provided in the improved display to drive different subpixels at different times (or "rotating the use of these different redundant subpixels) and thereby extend the average lifetime of a display, including micro LED displays with quantum dots color conversion (e.g., for red and green colors) as well as OLED and other graphics technologies, which may be subject to degradation over time. For instance, pixel driver circuits may be provided to independently address different redundant subpixels at specific time periods during the use of the display. Such a "rotation" scheme is used by using different redundant subpixels at different times (e.g., according to a frequency of rotation of 8 hours, 24 hours, or another time period). Such displays may realize in the lifetime of a corresponding micro LED displays with quantum dot color conversion being more than doubled, as well as realizing low power consumption. Similarly, such technology may enable to devices with more than double the brightness of a traditional device, but with a comparable lifetime, among other example advantages.

Figure 1B:
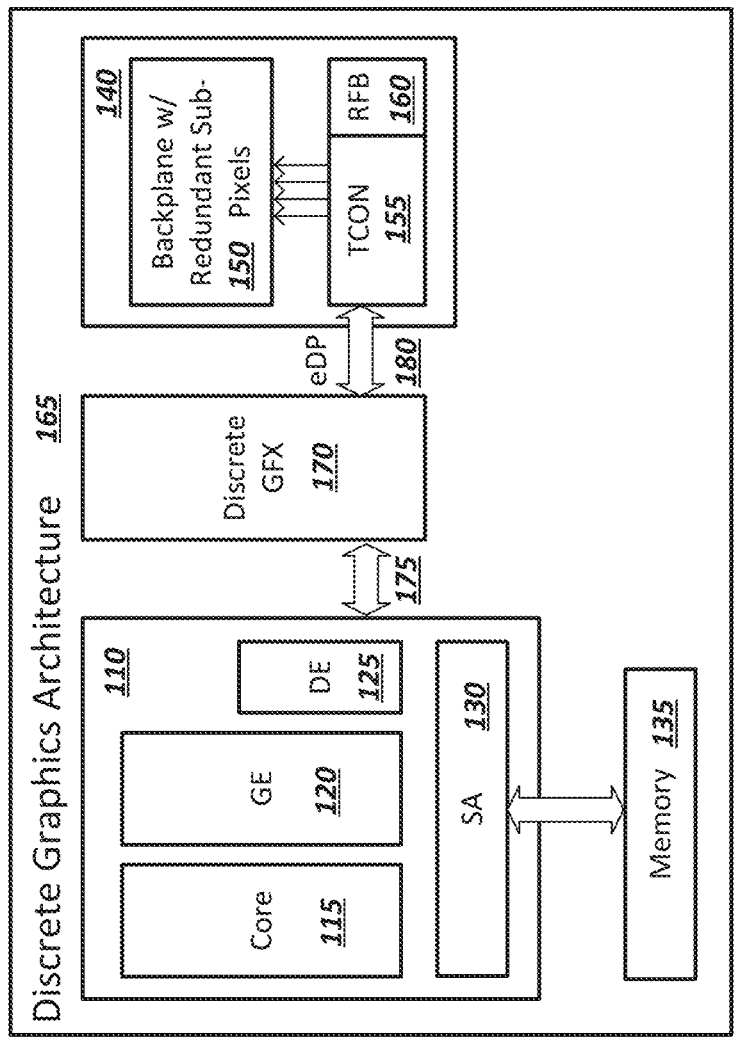

Turning to FIGS. 1A-1B, simplified block diagrams 100*a-b* are shown illustrating examples of graphics architectures, which may leverage the functionality and techniques discussed herein. For instance, FIG. 1A illustrates an example internal graphics architecture. In this example, a computing system 105 includes a system on chip (SoC) 110 (or alternatively a board) implementing the main microprocessor system including one or more processing cores (e.g., 115), a graphics engine 120 (e.g., implemented as an integrated and/or discrete graphic processing unit), a display engine 125 (e.g., implemented as an integrated or discrete video display controller), among other example microprocessor components for use in implemented a graphics display, such as a system agent (e.g., 130) or uncore interfacing with memory 135 (e.g., random access memory (RAM)) and providing cache coherency, memory I/O, and other memory controller functions to, among other example functionality and components.

Continuing with the example microarchitecture of FIG. 1A, the main processing system (e.g., 110) may interface with a display 140 using display engine 125 over a communication interface 145, such as an eDP interface. The display 140 may include a backplane 150 upon which LED segments may be implemented to realize the display 140. In this example, the LED segments may be implemented as sub-pixels, with redundant sub-pixels provided for one or more colors of the pixel. One or more timing controller (TCON) circuits 155 (e.g., implemented on a TCON board or chip) may be provided that receives display data (generated by display engine 125 based on graphics data generated by graphics engine 120) and orchestrates signaling of LEDs or LCD segments on the backplane 150 to realize the presentation of the corresponding graphics on the display 140. In some implementations, the TCON circuitry 155 may also be configured to implement rotation logic to rotate amongst redundant sub-pixels provided in the display. A remote frame buffer (RFB) 160 and other components (e.g., a scaler working in conjunction with and supporting the TCON) may also be provided to convert data received over interface 145 to orchestrate the corresponding activation of LEDs or LCD segments of the display to realize the desired graphical presentation on the display.

Turning to FIG. 1B, an additional example architecture is illustrated of a system 165 utilizing discrete graphics circuitry 170 (e.g., implemented as a discrete graphics card). As with the example of FIG. 1A employing exclusively integrated graphics circuitry, the example system in FIG. 1B may include one or more processor cores (e.g., 115), a system agent 130, memory 135 and one or more interfaces (e.g., 175), for instance, to interface a discrete graphics card or chip 170. In some instances, the system 165 (e.g., SoC) may additionally include an integrated graphics engine (e.g., 120) and display engine (e.g., 125) in addition to the discrete graphics card 170. In some instances, the discrete graphics card 170 may operate as a subordinate system with its own independent memory (e.g., so as not to utilize system memory 135). An integrated graphics approach, such as shown in FIG. 1A, may be designed such that the graphics engine utilizes the system RAM. In the case of a discrete graphics architecture (in FIG. 1B), the graphics card 170 may interface directly with the display 140 (e.g., over interface 180), to provide dedicated functionality similar to or as an alternative to an integrated graphics engine (e.g., 120) and display engine (e.g., 125), among other functionality, including specialized graphics processing functionality (e.g., adapted to gaming, specialized media, or other applications), and other example features.

In the cases of both architectures shown in the examples of FIGS. 1A-1B, the core graphics processing and associated memory is positioned and implemented separate from the display (e.g., 140). For instance, in a laptop, the SoC (e.g., 110), memory (e.g., 135), and graphic processing is contained within the base of the laptop and connected (e.g., through an ePD or MIPI connection) to the display located in the lid. In traditional systems, the portion of the device used to implement the display mainly consist of the display itself, some sensors (e.g., a camera, microphone, and other sensors), and in some cases (optionally) antennae for wireless communications. In an improved system, discussed herein and facilitated through the adoption of micro display technology, new portioning of compute and memory used in generating graphics on a display may be implemented in both the base (e.g., SoC) and the display (e.g., contained in the lid or display portion of the device). Further, as introduced herein, the additional per-pixel real estate facilitated through microLED technology may allow for multiple instances of the same color sub-pixel to be provided at each pixel and thereby provide multiple redundant instances of the sub-pixels, which may be selectively or periodically cycled through or rotated, for instance, by TCON circuitry, as discussed above, among other example features, such as those discussed below.

In a micro LED display, one pixel is composed of a plurality of sub-pixels having respective colors, so that a color can be represented in various ways by combining colors generated by one or more of the set of sub pixels designated to implement the corresponding pixel. In some systems, one pixel is composed of a set of sub-pixels including a sub pixel representing Red (R), a sub-pixel representing Green (G), and a sub-pixel representing Blue (B), and various colors can be represented by combinations of the red, green and blue. In order to drive these sub pixels, a circuit for driving a micro LED element for each sub pixel is provided. The set of sub-pixels may be further provided with a data line for accepting a data signal and a power line for providing an operating voltage, which may result in a number of transistors and lines to the subpixels in order to form a single pixel. Difficulties are encountered in arranging such circuitry within the area utilized to implement the pixel. In some instances, red micro LEDs made of GaN/InGaN solid state material have not been found to be efficient enough for display applications. As a stop-gap measure, some micro LED displays utilize quantum dot color conversion to convert blue micro LEDs for use in implementing red sub-pixels in the display. However, such implementations may limit the brightness of the display due to the degradaton of quantum dot color conversion film efficiently over time when driven by high brightness blue micro LEDs, among other example issues.

Figure 2:
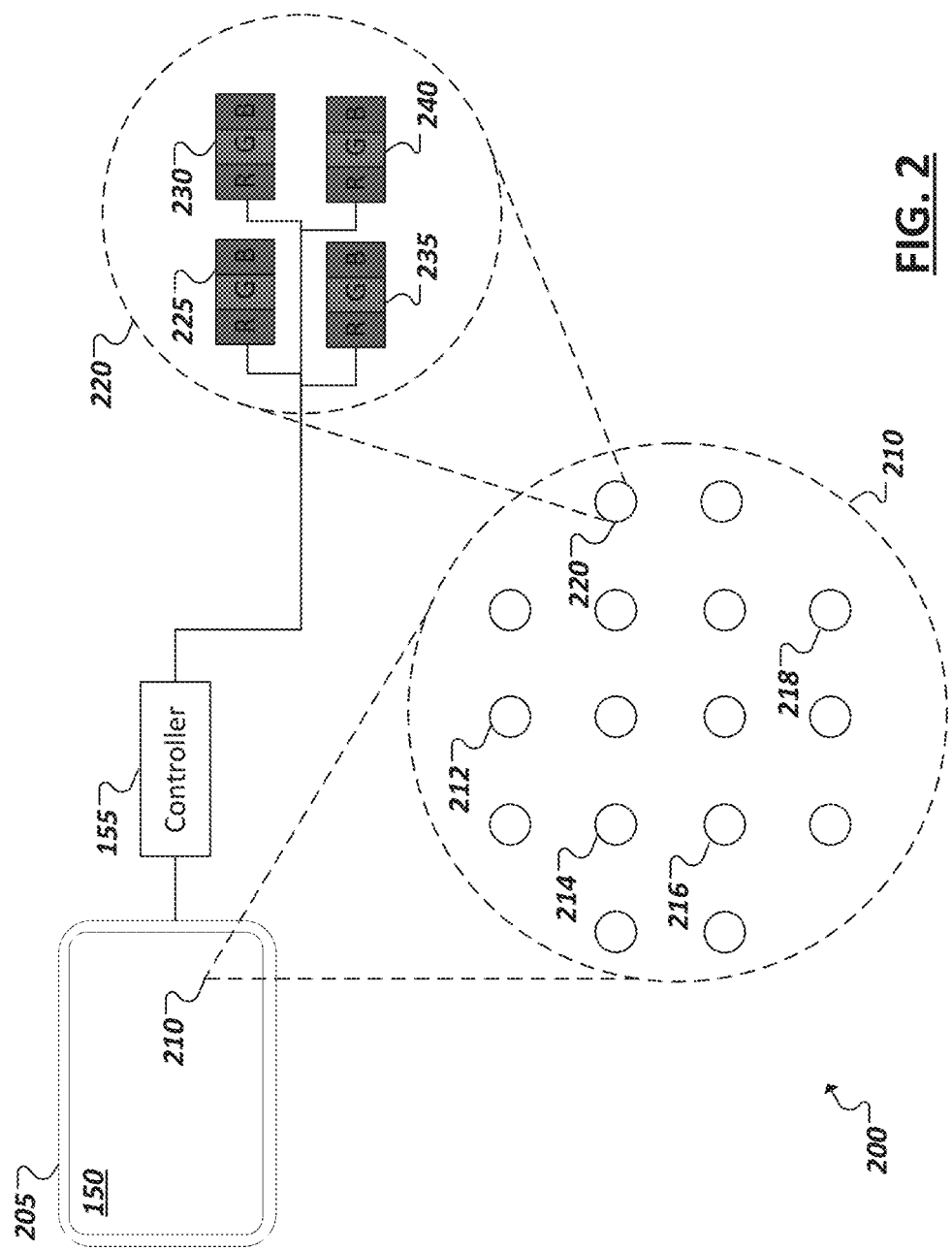
FIG. 2 is a simplified block diagram of an improved computer display architecture.

Turning to FIG. 2, a simplified block diagram 200 is shown illustrating an example implementation of an improved graphics architecture utilizing a display with redundant sub-pixel elements per pixel. As represented in FIG. 2, a display 205 may be provided which has a number of pixels, depending on its pixel resolution and dimensions. For instance, a segment 210 of the display may be composed of an array of pixels (e.g., 212, 214, 216, 218, 220, etc.). Each pixel (e.g., 220) may be implemented by a set of redundant sub-pixel elements. In this illustrative example, each pixel (e.g., 220) may have associated with it multiple, redundant sets of sub-pixel elements (e.g., 225, 230, 235, 240). In this example, each set (e.g., 225, 230, 235, 240) of sub-pixel elements includes a respective red sub-pixel element, green sub-pixel element, and a blue sub-pixel element. Each sub-pixel element may be implemented using a respective LED, such as a micro LED, OLED, quantum dot converted LED, among other examples. At any given time, one of the sets of sub-pixel elements may be selected and enabled (e.g., by controller circuitry 155) to implement the pixel (e.g., 220), with the other unselected sets of sub-pixel elements disabled or off. The controller 155 may rotate through the sets of sub-pixel elements, alternating use of each of the designated sets of sub-pixels (e.g., 225, 230, 235, 240) of the pixel (e.g., 220), thereby preserving the life span of each of the sets of sub-pixel elements, as well as the overall life of the display 205.

Figure 3A:
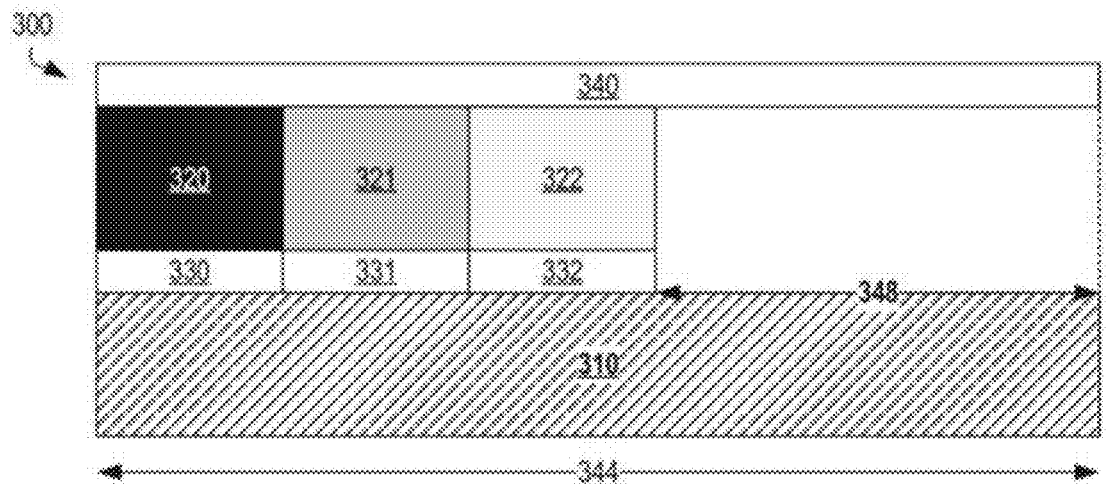
FIGS. 3A-3B illustrate simplified cross-sections of pixels in exemplary computer displays.
Figure 3B:
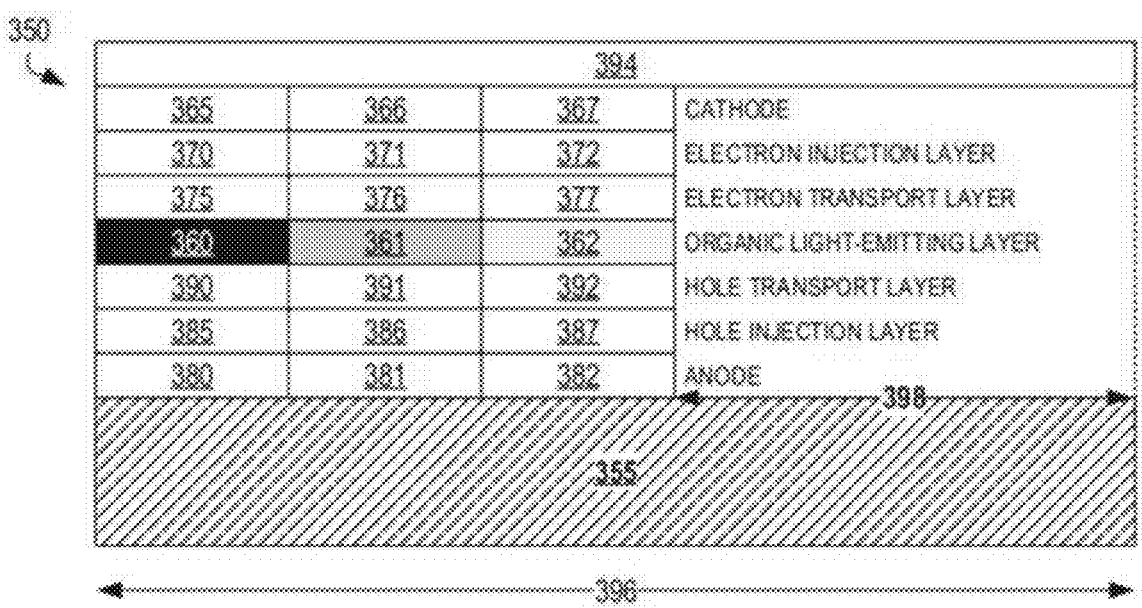

FIGS. 3A-3B illustrate simplified cross-sections of pixels in exemplary displays. FIG. 3A is a simplified illustration of the cross-section of a pixel in an exemplary micro-LED display. Micro-LED pixel 300 comprises a display substrate 310, a red LED 320, a green LED 321, a blue LED 322, electrodes 330-332, and a transparent display medium 340. The LEDs 320-322 are the individual light-producing elements for the pixel 300, with the amount of light produced by each LED 320-322 being controlled by the associated electrode 330-332.

The LED stacks (red LED stack (layers 320 and 330), green LED stack (layers 321 and 331) and blue LED stack (layers 322 and 332)) can be manufactured on a substrate using microelectronic manufacturing technologies. In some embodiments, the display substrate 310 is a substrate different from the substrate upon which the LEDs stacks are manufactured and the LED stacks are transferred from the manufacturing substrate to the display substrate 310. In other embodiments, the LED stacks are grown directly on the display substrate 310. In both embodiments, multiple pixels can be located on a single display substrate and multiple display substrates can be assembled to achieve a display of a desired size.

The pixel 300 has a pixel width 344, which can depend on, for example, display resolution and display size. For example, for a given display resolution, the pixel width 344 can increase with display size. For a given display size, the pixel width 344 can decrease with increased resolution. The pixel 300 has an unused pixel area 348, which is part of the black matrix area of a display. In some displays, the combination of LED size, display size, and display resolution can be such that the unused pixel area 348 can be large enough to accommodate the integration of components, such as microphones, within a pixel.

FIG. 3B is a simplified illustration of the cross-section of a pixel in an exemplary OLED display. OLED pixel 350 comprises a display substrate 355, organic light-emitting layers 360-362, which are capable of producing red (layer 360), green (layer 361) and blue (layer 362) light, respectively. The OLED pixel 350 further comprises cathode layers 365-367, electron injection layers 370-372, electron transport layers 375-377, anode layers 380-382, hole injections layers 385-387, hole transport layers 390-392, and a transparent display medium 394. The OLED pixel 350 generates light through application of a voltage across the cathode layers 365-367 and anode layers 380-382, which results in the injection of electrons and holes into electron injection layers 370-372 and hole injection layers 384-386, respectively. The injected electrons and holes traverse the electron transport layers 375-377 and hole transport layers 390-392, respectively, and electron-hole pairs recombine in the organic light-emitting layers 360-362 to generate light.

Similar to the LED stacks in micro-LED displays, OLED stacks (red OLED stack (layers 365, 370, 375, 360, 390, 385, 380), green OLED stack (layers 366, 371, 376, 361, 391, 386, 381), and blue OLED stack (layers 367, 372, 377, 362, 392, 386, 382), can be manufactured on a substrate separate from the display substrate 355. In some embodiments, the display substrate 355 is a substrate different from the substrate upon which the OLED stacks are transferred from the manufacturing substrate to the display substrate 355. In other embodiments, the OLED stacks are directly grown on the display substrate 355. In both types of embodiments, multiple display substrate components may need to be assembled in order to achieve a desired display size. The transparent display mediums 340 and 394 can be any transparent medium such as glass, plastic or a film. In some embodiments, the transparent display medium can comprise a touchscreen.

Again, similar to the micro-LED pixel 300, the OLED pixel 350 has a pixel width 396 that can depend on factors such as display resolution and display size. The OLED pixel 350 has an unused pixel area 398 and in some displays, the combination of OLED stack widths, display size, and display resolution can be such that the unused pixel area 398 is large enough to accommodate the integration of components, such as microphones, within a pixel.

As used herein, the term "display substrate" can refer to any substrate used in a display and upon which pixel display elements are manufactured or placed. For example, the display substrate can be a backplane manufactured separately from the pixel display elements (e.g., micro-LED/OLEDs in pixels 300 and 350) and upon which pixel display elements are attached, or a substrate upon which pixel display elements are manufactured.

As discussed above, some implementations of a display may utilize quantum dots to convert the light emitted from an LED of a first color (e.g., blue) into light of another desired color (e.g., red or green). FIG. 4 is a simplified block diagram 400 illustrating example use of quantum dot conversion in a micro LED display. Quantum dots (QDs), also known as QDs or fluorescent semiconductor nanocrystals, are tiny, single crystals ranging from 2-10 nm in diameter. QD size and shape can be precisely controlled by the duration, temperature, and ligand molecules used in the process of synthesis. A quantum dot may be "excited" to emit a single color determined by its size based on how the QD absorbs the light emitted from a corresponding excitation source. The bigger QDs are red and are usually as big as 7 nm (150 atoms) in diameter, while green particles are about 3 nm (30 atoms) in diameter. Blue QDs are the smallest—their core size is about 2 nm (15 atoms) in diameter, making blue QDs vulnerable and challenging to work with. An excitation source, such as an LED (e.g., an ultraviolet or blue microLED) may be used with a QD-based color conversion material achieve specific sub-pixel colors. For this reason, red and green QDs are most frequently used in panel technologies. In the example of FIG. 4, an example implementation of a set of sub-pixels (e.g., 225) is shown for a particular pixel of a display, including red and green sub-pixels implemented using QD-based color conversion. For instance, each of the red, green, and blue sub-pixels may be implemented by a corresponding blue microLED (e.g., 405, 410, 415). The LED 415 for the blue sub-pixel may naturally emit the corresponding blue light 420. The red and green sub-pixels may be implemented by depositing a QD-based conversion layer or film (e.g., 425, 430) on top of its blue microLED (e.g., 405, 410)) to cause the corresponding red (e.g., 435) and green (e.g., 440) lights to be generated at the sub-pixel element.

FIGS. 5A-5D are diagrams 500a-d illustrating the example rotating selection and use of individual redundant sub-pixels to implement a single particular pixel in an improved display. In this example, four sets of redundant sub-pixel elements (e.g., 225, 230, 235, 240) may be provided to implement a particular pixel 220. Each set of sub-pixel elements (e.g., 225, 230, 235, 240) may include a red sub-pixel element, blue sub-pixel element, and blue sub-pixel element controllable together to generate a spectrum of different colors at the pixel. For simplicity, in the example of FIGS. 5A-5D, the particular pixel 220 may be called upon at different times (based on corresponding display data) to generate the color red at the pixel 220 by driving and illuminating only a red sub-pixel element (although at other times, based on other data, other sub-pixels, including combinations of sub-pixel elements, may be driven and illuminated).

Figure 5B:
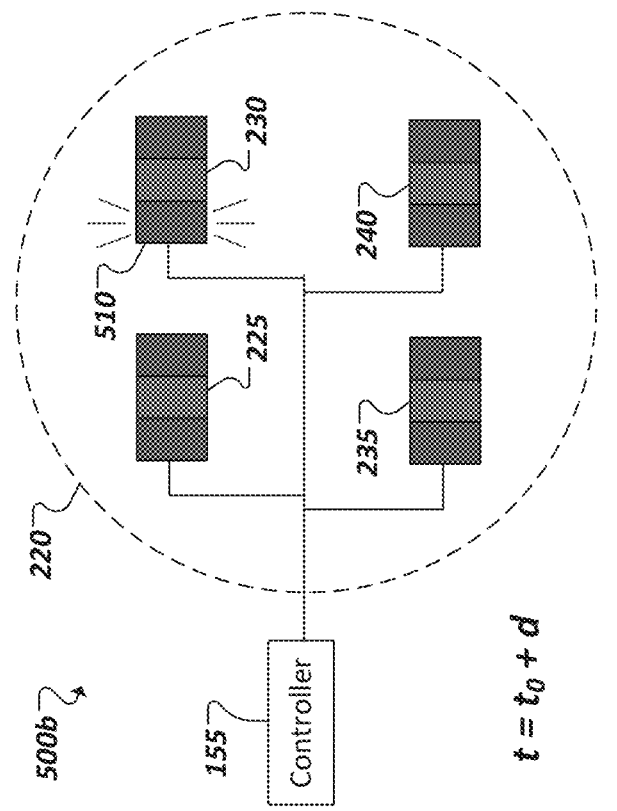
FIGS. 5A-5D are diagrams illustrating rotating enablement of sub-pixels in an example display.
Figure 5A:
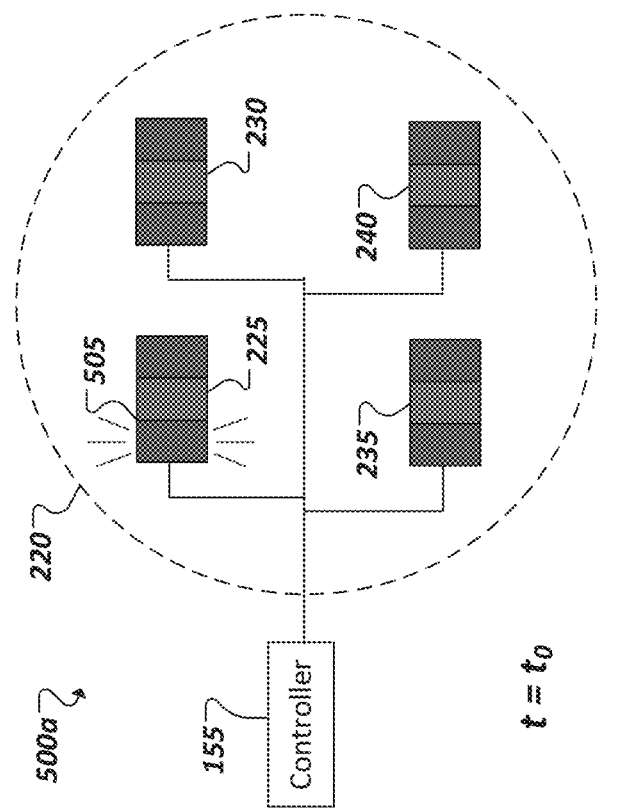

In this example, as shown in FIG. 5A, at a time $t=t_0$, only one (e.g., 225) of the redundant sets of sub-pixels (e.g., 225, 230, 235, 240) may be enabled, such only the sub-pixel elements of that set 225 are used to illuminate the pixel 220 to a corresponding color. For instance, to generate the color red at the pixel 220 during a time window in which the set 225 is enabled, red sub-pixel element 505 will be driven in set 225. Controller logic 155 may cause the corresponding combination of sub-pixel elements to be driven to cause a color to be displayed at the pixel corresponding to display data fed to the display. Additionally, controller logic 155 may control the rotating use of the sets of sub-pixels of the display. For instance, time windows may be defined, with each set of sub-pixels assigned for use within a corresponding one of the time windows. As an example, a period or rotation frequency may be defined or configured for the display, such as an 8-hour, 24-hour, or other time window length d. For instance, at the close of a time window, the controller 155 may enable another one of the sets of sub-pixels (e.g., 230) to be enabled, while disabling the previously enabled set (e.g., 225) to place the previously enabled set in a disabled state along with the other redundant sets of sub-pixels, until the next window assigned to the set begins.

Figure 5D:
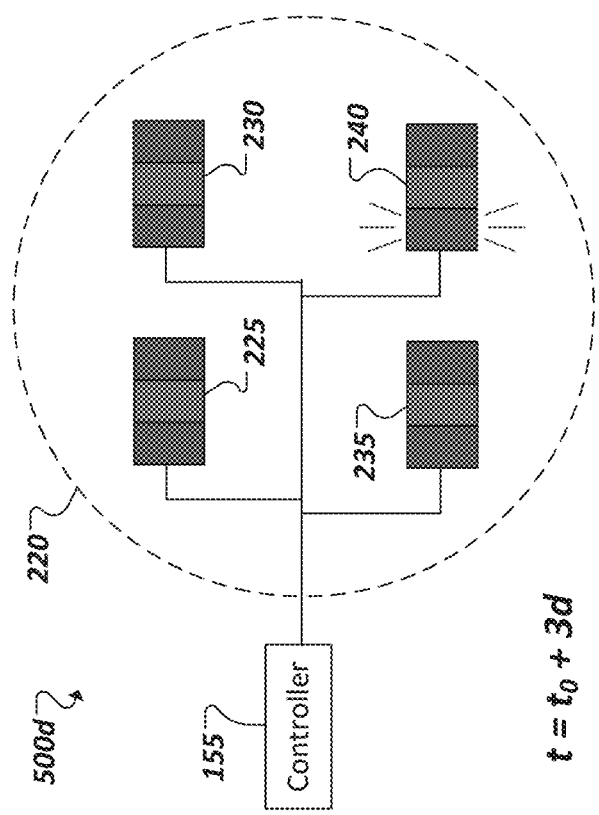
Figure 5C:
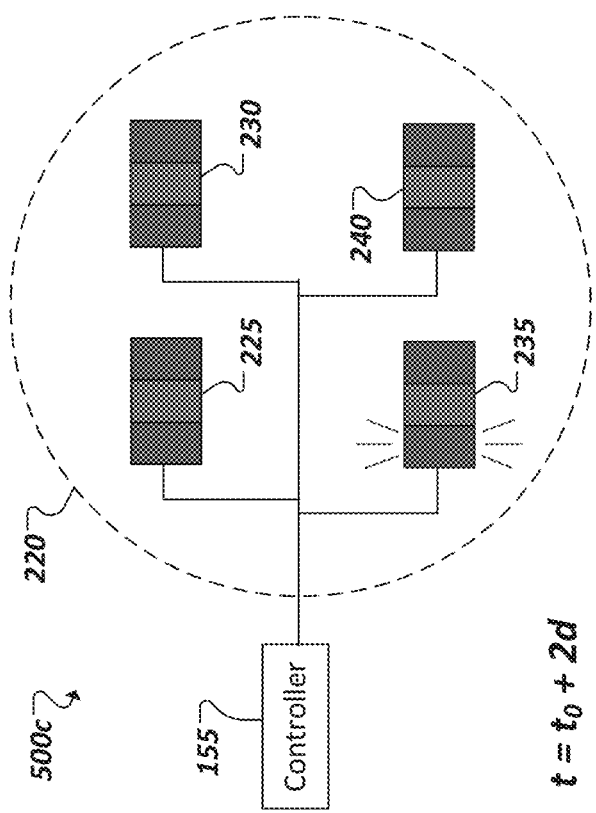

For instance, as shown in FIG. 5B, at time $t=t_0+d$, sub-pixels 230 may be enabled, such that whenever the color red is to again be displayed at pixel 220, the red sub-pixel 510 in the set 230 is to be illuminated (i.e., rather than red sub-pixel 5050 in the now disabled set 225). Similarly, in an example with four redundant sets of sub-pixels (such as in the present example), the controller 155 may further "rotate" the enablement of the redundant sets of sub-pixels, by enabling set 235 in the next time window (as shown in FIG. 5C) and set 240 in the following time window (as shown in FIG. 5D), before returning to set 220, and so on.

Figure 6A:
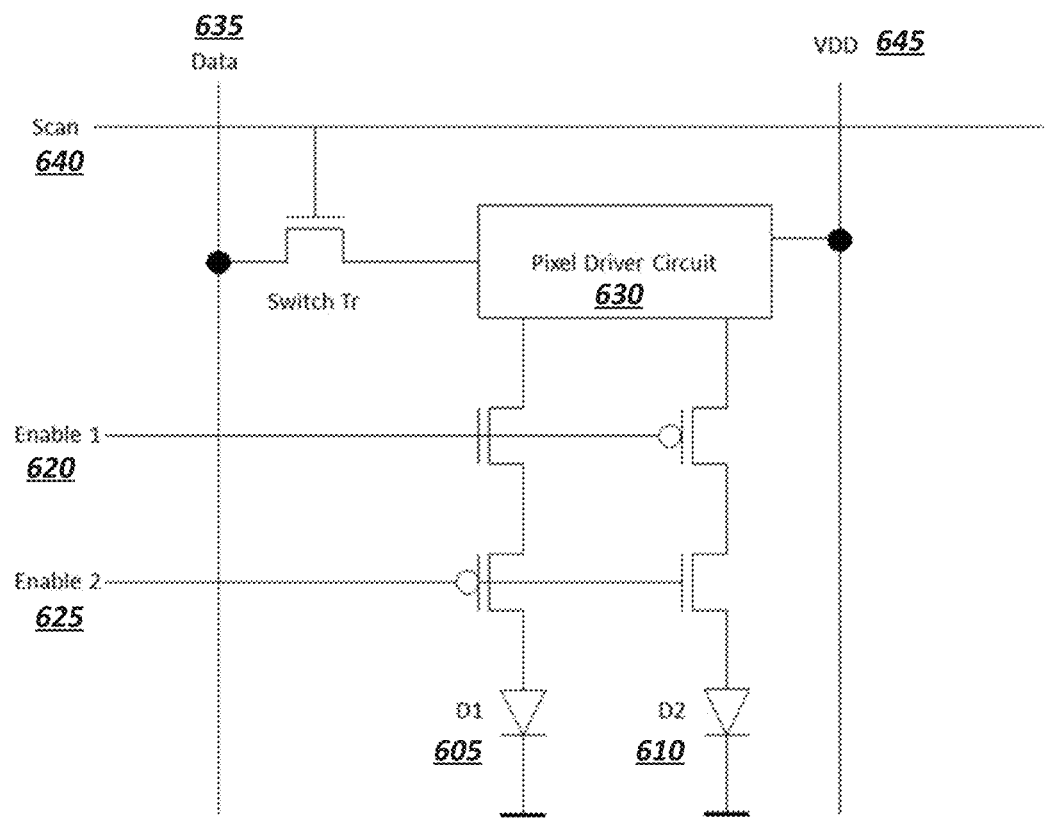
FIGS. 6A-6C are diagrams illustrating example control circuitry of a display in accordance with at least some embodiments.

A variety of controller logic (e.g., implemented in hardware circuitry, firmware, and/or hardware) may be utilized to control the rotation and illumination of sets of sub-pixels in a display. For instance, FIG. 6A shows a diagram 600a of an example pixel driver architecture. In one example, the pixel driver circuit 630 may be implemented as a pulse width modulation (PWM) circuit. Redundant micro LEDs D1 (605) and D2 (610) (e.g., LEDs of the same color used to implement the same pixel) may be provided. The pixel driver circuit may be provided power by a voltage input 645, with data 635 and scan lines 640 dictating the color state to be implemented at the pixel and timing of illumination of the pixel. Enable 1 (620) and Enable 2 (625) inputs may be provided to be signaled by controller circuitry to select, which of the redundant LEDs (e.g., 605, 610) to enable within a given rotation window. For instance, Enable 1 (620) and Enable 2 (625) will be "HIGH" sequentially in time, and complementary to each other such that one is HIGH and the other is LOW and vice versa, resulting in either LED 605 or LED 610 being enabled for driving using pixel driver circuit 630.

Figure 6B:
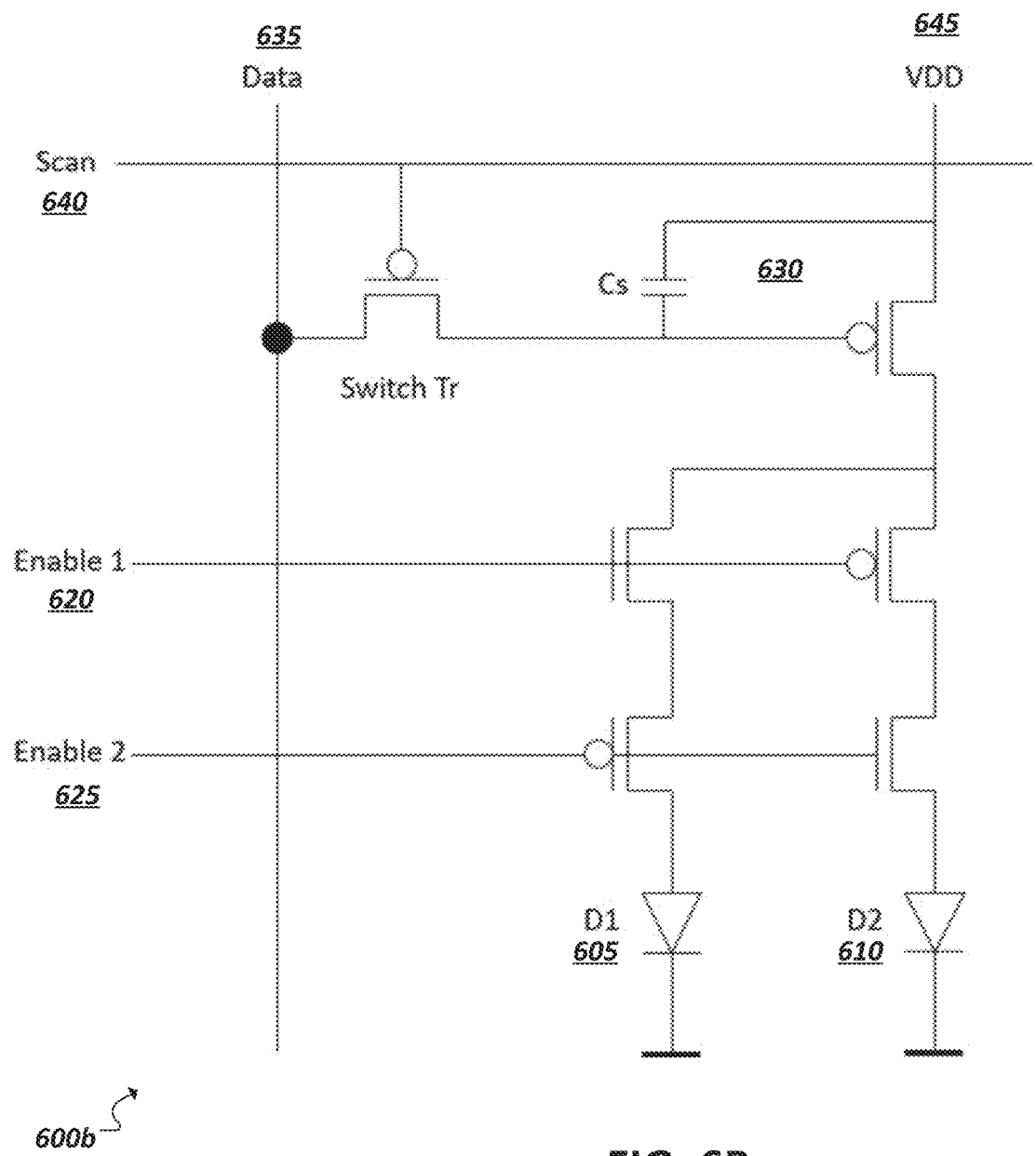

FIG. 6B shows a diagram 600b of another example of control circuitry to be provided for redundant LEDs (e.g., 605, 610). LEDs may be implemented as microLEDs, OLEDs, or other using other LED-based technology. In some implementations, the coloration of the LED may be achieved using QD conversion, such as discussed above. For instance, in the example of FIG. 6B, two blue micorLEDs 605, 610 are controlled by the same driver circuit 630, but with the addition of a switch transistor in series with each blue microLED 605, 610 and a corresponding enable line 620, 625. In one example, the blue microLEDs 605, 610 may be used to implement another sub-pixel color, such as a red sub-pixel by coating the microLEDs 605, 610 with a quantum dot color conversion film configured to produce a red color upon illumination of the corresponding microLED (e.g., 605, 610), among other examples.

Figure 6C:
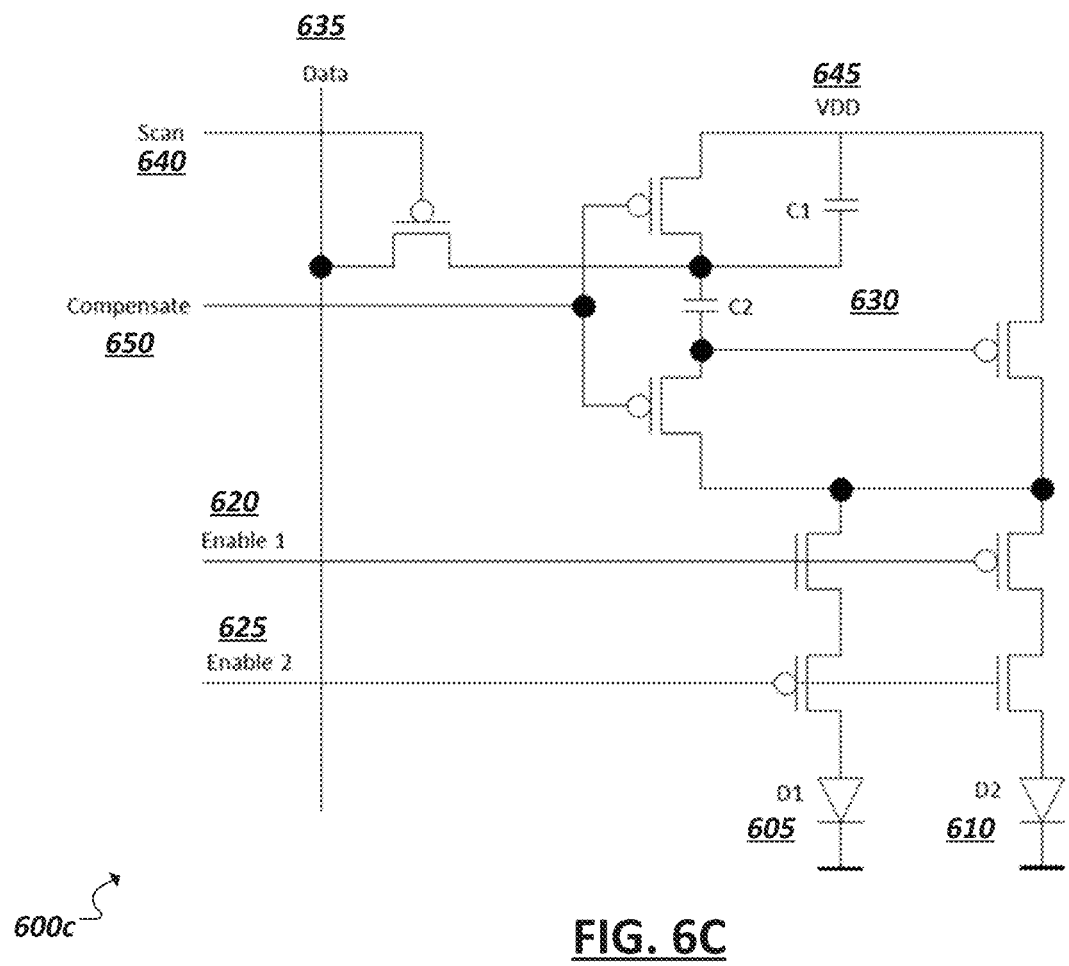

FIG. 6C is a diagram 600c showing yet another example implementation of control circuitry for use in controlling the rotation of redundant LED sub-pixels. For instance, the driver circuit 630 may include a compensation circuit (e.g., 650) for thin film transitory (TFT) threshold voltage shift with time. In this example, two redundant LED elements (e.g., 605, 610) are controlled by the same driver circuit 630, but with the addition of a switch transistor in series with each redundant LED 605, 610 and a corresponding enable line (e.g., 620, 625), among other example implementation. Controller circuitry (e.g., TCON circuitry) may be utilized to provide signals at one or more of the lines (e.g., 620, 625, 635, 640, 650, etc.) used to orchestrate the appropriate rotation and driving sub-pixel illumination in the enable sub-pixel set.

An example display may be provided with a display timing controller (TCON) configured to manage rotation and driving of the redundant LEDs within given subpixels. For instance, two or more redundant sub-LEDs may be provided per color component for a given pixel—the TCON may control how and when each of these redundant sets of LED elements are used, such as discussed above. For instance, two or more enable pins may be used by the TCON to control, which redundant sub-pixel elements are enabled, and which are disabled. For instance, turning to FIG. 7A, a diagram 700a is shown illustrating an example TCON 155 in communication with an array of LED elements on a portion of a backplane 150 of a display device.

Figure 7A:
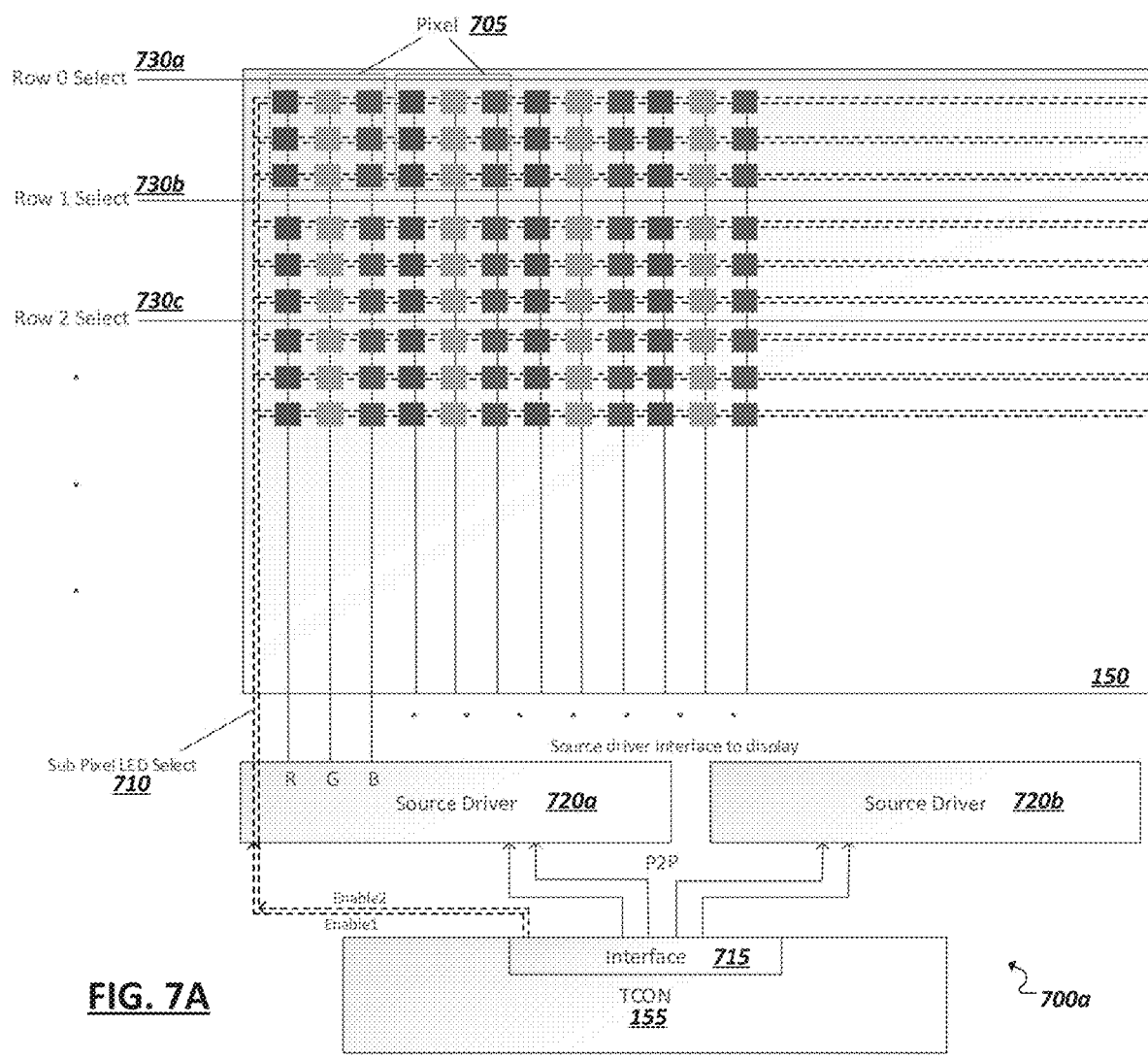
FIGS. 7A-7B are simplified block diagrams illustrating example control of redundant sub-pixels in a display in accordance with at least one embodiment.

In the example of FIG. 7A, an interface 715 of a TCON 155 may be used to selectively engage source driver circuitry (e.g., 720a,b) to drive rows (e.g., 730a-c) of pixels in the display as well as the individual sub-pixel elements (e.g., red, green, and blue) of the array of pixels to cause corresponding graphics to be displayed. Further, redundant sets of sub-pixels may be provided to implement each pixel (e.g., 705) in the display. In this example, three redundant sets of red, green, and blue LED elements may be provided to redundantly implement each pixel (e.g., 705). Enable signals (e.g., provided on sub-pixel select lines 710) may be utilized by the TCON to select, which of the redundant sub-pixel sets to enable (with the other unselected sub-pixel sets disabled).

The TCON can be programmed to periodically cycle through the LEDs implementing the sub-pixels of a pixel in order to equally age each LED in the set of redundant LEDs and thereby increase the overall lifetime of each color component. For instance, the TCON be programmatically configured to switch or rotate the redundant LEDs every couple of minutes, hours, or days (e.g., using a hardware timer). For instance, in the example of FIG. 7A, the lifetime of each pixel may be tripled given the three redundant LEDs per color component in each pixel. The TCON 155 may keep track of the display ON time, and as soon as programmed time is met it may reprogram the LED selects using the enable pins to rotate to the next set of sub-pixel LEDs. In some instances, if the display is turned off the TCON will pause its timer and save the LED ON time in a non-volatile storage, and during resume/power-on restore the LED ON time from storage to ensure each LED is aged equally. In some instances, the LED switch is performed sequentially, as each row is selected by the row driver. Additionally, the switch or rotation from one set of sub-pixel LEDs to the next is to be carried out instantly (e.g., between scans) such that there is no visual artifact resulting from the rotation.

As illustrated in the example of FIG. 7A, the enable traces controlled by the TCON to selectively enable redundant sets of LEDs may be routed to each pixel such that the TCON 155 can access each pixel using the same enable pins. Even though implementations may utilize multiple source drivers, the enable pins may be routed through one source driver integrated circuit (IC), such as shown in FIG. 7A. The enable pins may be used to define a set of signals to identify that a specific one of the redundant sets of LEDs is to be enabled, such as shown in the example of Table 1 below:

|  | Enable 1 | Enable 2 |
| --- | --- | --- |
| 1st LED | 0 | 1 |
| 2nd LED (redundant) | 1 | 0 |
| 3rd LED (redundant) | 0 | 0 |

The display timing controller (TCON) will be responsible for managing the redundant LED's within subpixel. For instant when there are two redundant sub-LED's per color component, two enable pins can be used by TCON as shown in FIG. 7A. Implementations with more or fewer redundant LED sub-pixels may be augmented to accommodate for the selection and rotation of the corresponding number of redundant sub-pixels.

Figure 7B:
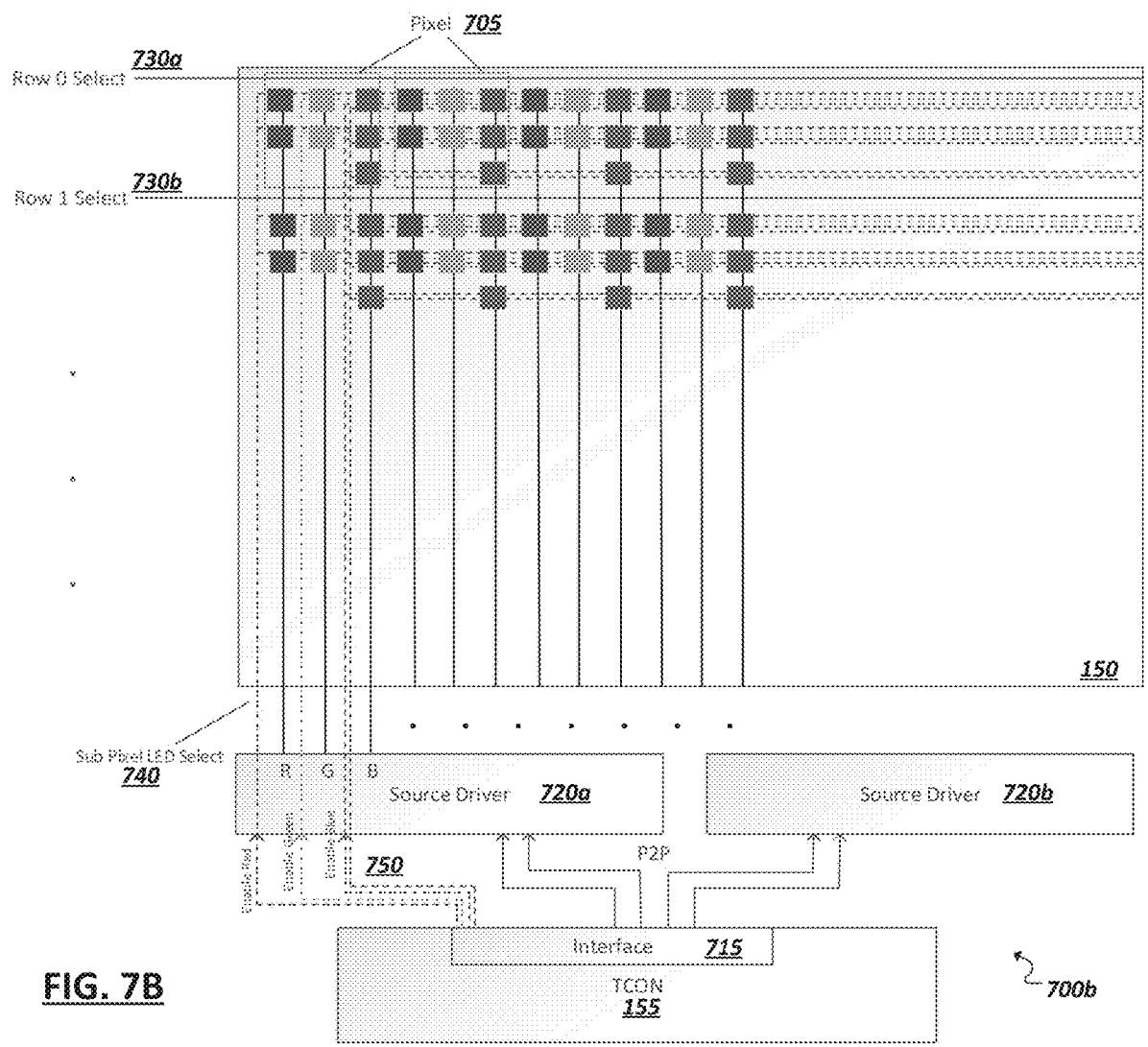

Turning to the example of FIG. 7B, in some implementations, a subset of the sub-pixels for each pixel in a display may be more susceptible to degradation than others. For instance, sub-pixels implemented using quantum dot conversion films may be more prone to degrade. Accordingly, in some implementations, redundant sub-pixels may be provided for only some of the sub-pixel colors, or more redundant instances than others of one of the sub-pixel colors than others may be provided. Accordingly, a redundant set of sub-pixels may, in some implementations, include less than all of the sub-pixels used to implement a pixel, reserving or expanding that redundancy for sub-pixels more in needs of assistance in extending the life of the corresponding LED element. In the example of FIG. 7B, a TCON may support signaling in such asymmetric use cases, where different numbers of LED elements are provided for one of the color components (e.g., 3 LEDs to implement a blue sub-pixel for the pixel 705) than other color components (e.g., with 2 LEDs each for the respective red and green sub-pixels of the pixel 705), among other examples.

In some implementations, rotation between redundant sub-pixels for a pixel may be according to a configurable rotation frequency, where rotation occurs at a set cadence (e.g., a number of minutes, hours, days, etc.). The rotation frequency may be changed to defined different enablement time windows. In some implementations, the rotation frequency may be changed at runtime, for instance, based on conditions identified affecting the display. In other instances, rotation frequency may be set at boot time or may be statically defined, among other implementations. For instance, pixel history data may be maintained to identify pixels within the display that should be rotated more frequently, among other example features. Such displays may be incorporated in devices such as notebook computers, tablet computers, smart phones, smart displays, televisions, in-vehicle displays, and other systems. The rotation frequency may be based, at least in part, on the type of device, the applications run on the device (which affect the graphical information to be presented on the display), among other example factors.

Figure 8:
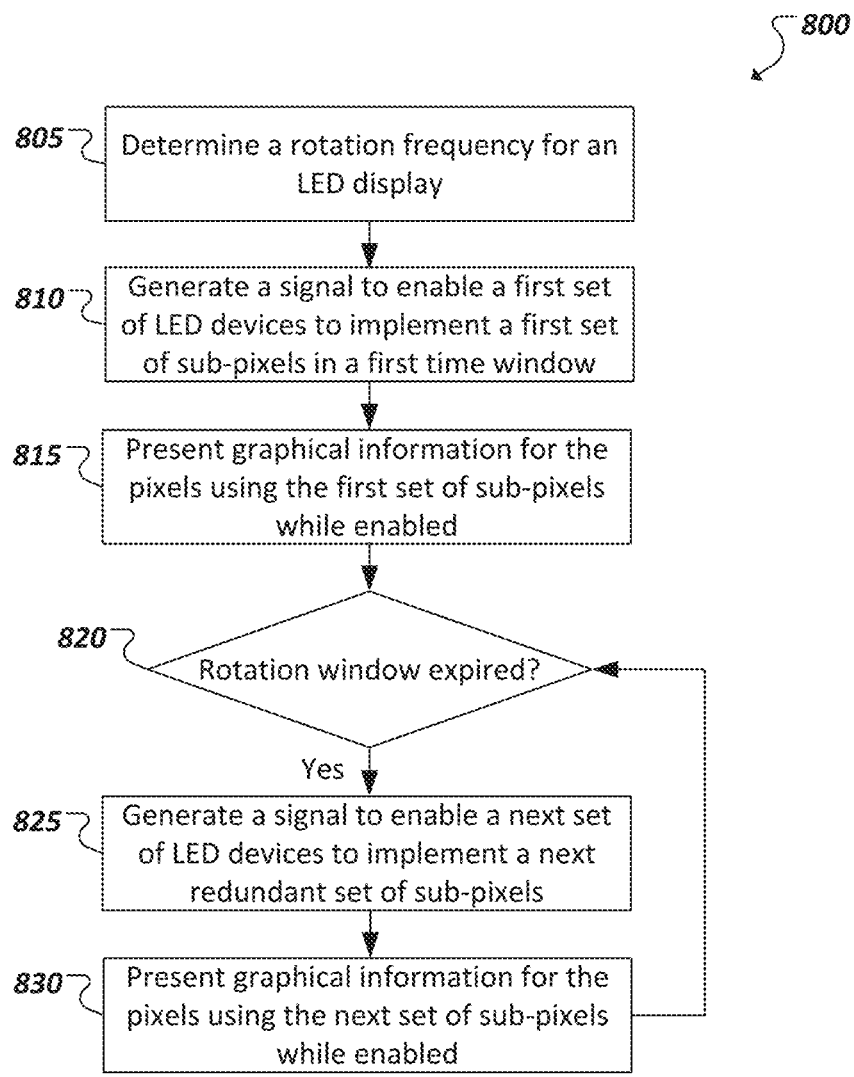
FIG. 8 is a flowchart of an example technique for using a display in accordance with at least one embodiment.

Turning to FIG. 8, a simplified block diagram 800 is shown illustrating example techniques for using a display device incorporating redundant sub-pixel sets, such as discussed herein. For instance, a rotation frequency may be determined 805 for a device to govern the frequency at which controller circuitry of the display is to rotate between redundant sets of sub-pixels in the display. Each pixel may have associated with it two or more subsets of LED elements to implement two or more sets of redundant sub-pixels. Sets of sub-pixels are redundant if there is at least one of the sub-pixels of the pixel redundantly provided between the two sets. Based on the rotation frequency, controller circuitry may generate 810 and send a signal to enable a first one of the sets of LED elements for use in implementing the sub-pixels of each pixel during a time window corresponding to the rotation frequency. Graphical information may be presented 815 on the display through driving and illuminating the enabled first subset of LED devices during this time window, while the other subsets of LEDs used to implement the redundant sub-pixels for each pixel are disabled and not driven. When the current rotation window expires (at 820), the controller circuitry may generate 825 a corresponding signal to cause the LED devices implementing the next set of redundant sub-pixels to be driven in a next time window. This signal also causes the disabling of LED devices outside this next set of LED devices. Accordingly, in this next time window, the newly enabled subset of LED devices are used to present 830 graphical information for the pixels of the display. This continues until the expiration of the rotation window (e.g., 820), where a next signal is generated and sent to cause the next subset of sub-pixels to be implemented using another subset of LED device provided for each pixel and so on, to rotatably balance use of the sub-pixels and prolong the life of the display, among other example advantages.

In some implementations, a microLED display is provided with more than one microLED per color per pixel to implement redundant sub-pixels for the pixel. These redundant microLED devices are separately driven based on signals from a controller (e.g., TCON). In some instances, the redundant microLEDs per color per pixel are driven by one-pixel driver circuit and m number of enable transistors that are connected in series with each redundant microLED. Of the m-number of series enabling transistors, one transistor may be a p-channel type, and the rest n-channel types. The driving electronics chip may be used to render the color information for a given pixel to one of the redundant, enabled microLEDs per color per pixel at one given time, while other redundant uLEDs per color per pixel are not driven by any current. In some examples, the redundant micorLEDs per color per pixel are used one at a time sequentially in time so that the burn-in issue is eliminated or significantly reduced.

In some implementations, n-channel thin film transistors used in the control circuitry may be manufactured on "one layer" above the glass substrate (or any substrate), then a bonding layer (e.g. oxide) may be added, with all p-channel thin film transistors then manufactured on a new layer. The connections between n-channel TFTs and p-channel TFTs may be achieved using interconnect vias. Such an approach, utilizing a stacked TFT backplane, may assist in facilitating efficient manufacturing of such displays where the number of transistors required to drive one micoLED subpixel are relatively large to achieve the rotating control of the redundant subpixels. p-channel TFTs may be implemented using (low temperature polysilicon (LTPS) and the n-channel TFTs may be implemented using oxide semiconductor (In-GaZnO) TFTs, among other example implementations. Indeed, in some implementations, the n-channel TFTs may be implemented using LTPS TFTs.

In some implementations, the rotation frequency of various microLEDs per color per pixel may be chosen such that there are no visual artifacts. It should be appreciated that, while many of the examples herein discuss the use of microLED displays, the principles discussed herein, including the redundant implementation of sub-pixels and rotation between these redundant sets of sub-pixels, may be applied to other LED-based displays, including OLED and quantum LED (QLED) displays, among other examples.

In some implementations, controller logic, such as a TCON, may be provided with logic to be responsible for managing the redundant LEDs for a given subpixel. For instance, when there are three redundant sub-LEDs per color component, two enable pins can be used by TCON to define sufficient enable signals to cause each redundant LED to be alternatively enabled. A TCON can be programmed to periodically cycle through the LEDs in order to equally age each LED, hence increase the lifetime of each color component. In some implementations, the TCON can track the display ON time, as the display level or at an LED subset level. When a programmed time window is set to close, the TCON can reprogram the LED selects using the enable pins to enable a new subset of the LED elements. In some cases, when the display is turned off the TCON may save the LED ON time in a non-volatile storage, and during resume/power-on restore the LED ON time from storage to ensure each LEDs are aged equally. Similarly, in implementations where sub-pixel color components are implemented using different numbers of redundant LED elements, the TCON may engage in more complex signaling to manage the different color component different and ensure the redundant LEDs are cycled so that LEDs do not age differently, among other example features.

The technologies, techniques, and embodiments described herein can be performed by any of a variety of computing devices, including mobile devices (e.g., smartphones, handheld computers, laptops, notebooks, tablets, media players, portable gaming consoles, cameras), non-mobile devices (e.g., desktop computers, servers, stationary gaming consoles, set-top boxes, televisions) and embedded devices (e.g., devices incorporated into a vehicle, home or place of business). For instance, high brightness and high dynamic range display applications, such as monitors used in gaming applications, may particularly benefit from solutions discussed herein. As another example, displays utilizing quantum dot color conversion (e.g., where blue LEDs are used to with red and/or green quantum dot conversion layers to generate red and/or green sub-pixels) may also benefit from the provisioning of redundant LED elements to implement such sub-pixels, among other examples. As used herein, the term "computing devices" includes computing systems and includes devices comprising multiple discrete physical components.

Figure 9:
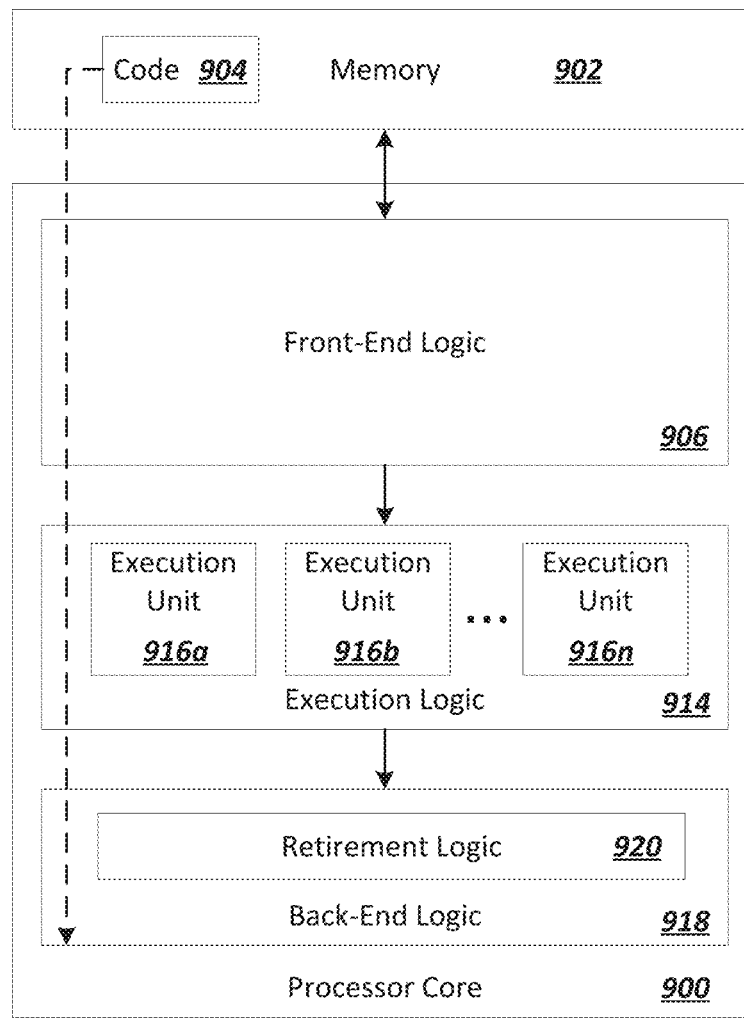
FIG. 9 is a block diagram of an exemplary processor in accordance with one embodiment.
Figure 10:
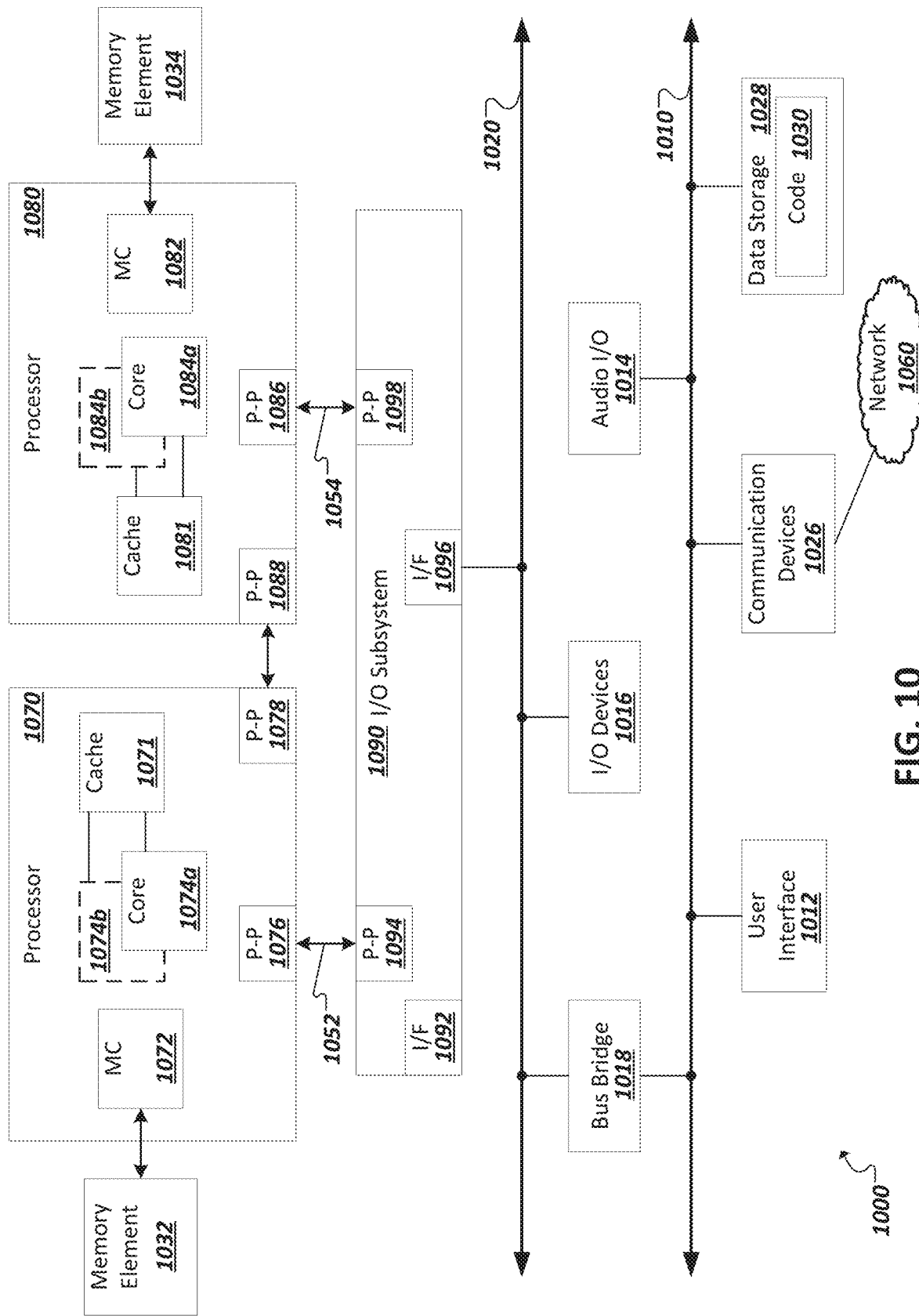
FIG. 10 is a block diagram of an exemplary computing system in accordance with one embodiment.

FIGS. 9-10 are block diagrams of exemplary computer architectures that may be connected to, embedded with, or otherwise interoperate with the display devices in accordance with embodiments disclosed herein. Other computer architecture designs known in the art for processors and computing systems may also be used. Generally, suitable computer architectures for embodiments disclosed herein can include, but are not limited to, configurations illustrated in FIGS. 9-10.

FIG. 9 is an example illustration of a processor according to an embodiment. Processor 900 is an example of a type of hardware device that can be used in connection with the implementations above. Processor 900 may be any type of processor, such as a microprocessor, an embedded processor, a digital signal processor (DSP), a network processor, a multi-core processor, a single core processor, or other device to execute code. Although only one processor 900 is illustrated in FIG. 9, a processing element may alternatively include more than one of processor 900 illustrated in FIG. 9. Processor 900 may be a single-threaded core or, for at least one embodiment, the processor 900 may be multi-threaded in that it may include more than one hardware thread context (or "logical processor") per core.

FIG. 9 also illustrates a memory 902 coupled to processor 900 in accordance with an embodiment. Memory 902 may be any of a wide variety of memories (including various layers of memory hierarchy) as are known or otherwise available to those of skill in the art. Such memory elements can include, but are not limited to, random access memory (RAM), read only memory (ROM), logic blocks of a field programmable gate array (FPGA), erasable programmable read only memory (EPROM), and electrically erasable programmable ROM (EEPROM).

Processor 900 can execute any type of instructions associated with algorithms, processes, or operations detailed herein. Generally, processor 900 can transform an element or an article (e.g., data) from one state or thing to another state or thing.

Code 904, which may be one or more instructions to be executed by processor 900, may be stored in memory 902, or may be stored in software, hardware, firmware, or any suitable combination thereof, or in any other internal or external component, device, element, or object where appropriate and based on particular needs. In one example, processor 900 can follow a program sequence of instructions indicated by code 904. Each instruction enters a front-end logic 906 and is processed by one or more decoders 908. The decoder may generate, as its output, a micro operation such as a fixed width micro operation in a predefined format, or may generate other instructions, microinstructions, or control signals that reflect the original code instruction. Front-end logic 906 also includes register renaming logic 910 and scheduling logic 912, which generally allocate resources and queue the operation corresponding to the instruction for execution.

Processor 900 can also include execution logic 914 having a set of execution units 916a, 916b, 916n, etc. Some embodiments may include a number of execution units dedicated to specific functions or sets of functions. Other embodiments may include only one execution unit or one execution unit that can perform a particular function. Execution logic 914 performs the operations specified by code instructions.

After completion of execution of the operations specified by the code instructions, back-end logic 918 can retire the instructions of code 904. In one embodiment, processor 900 allows out of order execution but requires in order retirement of instructions. Retirement logic 920 may take a variety of known forms (e.g., re-order buffers or the like). In this manner, processor 900 is transformed during execution of code 904, at least in terms of the output generated by the decoder, hardware registers and tables utilized by register renaming logic 910, and any registers (not shown) modified by execution logic 914.

Although not shown in FIG. 9, a processing element may include other elements on a chip with processor 900. For example, a processing element may include memory control logic along with processor 900. The processing element may include I/O control logic and/or may include I/O control logic integrated with memory control logic. The processing element may also include one or more caches. In some embodiments, non-volatile memory (such as flash memory or fuses) may also be included on the chip with processor 900.

FIG. 10 illustrates a computing system 1000 that is arranged in a point-to-point (PtP) configuration according to an embodiment. In particular, FIG. 10 shows a system where processors, memory, and input/output devices are interconnected by a number of point-to-point interfaces. Generally, one or more of the computing systems described herein may be configured in the same or similar manner as computing system 900.

Processors 1070 and 1080 may also each include integrated memory controller logic (MC) 1072 and 1082 to communicate with memory elements 1032 and 1034. In alternative embodiments, memory controller logic 1072 and 1082 may be discrete logic separate from processors 1070 and 1080. Memory elements 1032 and/or 1034 may store various data to be used by processors 1070 and 1080 in achieving operations and functionality outlined herein.

Processors 1070 and 1080 may be any type of processor, such as those discussed in connection with other figures. Processors 1070 and 1080 may exchange data via a point-to-point (PtP) interface 1050 using point-to-point interface circuits 1078 and 1088, respectively. Processors 1070 and 1080 may each exchange data with a chipset 1090 via individual point-to-point interfaces 1052 and 1054 using point-to-point interface circuits 1076, 1086, 1094, and 1098. Chipset 1090 may also exchange data with a co-processor 1038, such as a high-performance graphics circuit, machine learning accelerator, or other co-processor 1038, via an interface 1039, which could be a PtP interface circuit. In alternative embodiments, any or all of the PtP links illustrated in FIG. 10 could be implemented as a multi-drop bus rather than a PtP link.

Chipset 1090 may be in communication with a bus 1020 via an interface circuit 1096. Bus 1020 may have one or more devices that communicate over it, such as a bus bridge 1018 and I/O devices 1016. Via a bus 1010, bus bridge 1018 may be in communication with other devices such as a user interface 1012 (such as a keyboard, mouse, touchscreen, or other input devices), communication devices 1026 (such as modems, network interface devices, or other types of communication devices that may communicate through a computer network 1060), audio I/O devices 1014, and/or a data storage device 1028. Data storage device 1028 may store code 1030, which may be executed by processors 1070 and/or 1080. In alternative embodiments, any portions of the bus architectures could be implemented with one or more PtP links.

The computer system depicted in FIG. 10 is a schematic illustration of an embodiment of a computing system that may be utilized to implement various embodiments discussed herein. It will be appreciated that various components of the system depicted in FIG. 10 may be combined in a system-on-a-chip (SoC) architecture or in any other suitable configuration capable of achieving the functionality and features of examples and implementations provided herein.

While some of the systems and solutions described and illustrated herein have been described as containing or being associated with a plurality of elements, not all elements explicitly illustrated or described may be utilized in each alternative implementation of the present disclosure. Additionally, one or more of the elements described herein may be located external to a system, while in other instances, certain elements may be included within or as a portion of one or more of the other described elements, as well as other elements not described in the illustrated implementation. Further, certain elements may be combined with other components, as well as used for alternative or additional purposes in addition to those purposes described herein.

Further, it should be appreciated that the examples presented above are non-limiting examples provided merely for purposes of illustrating certain principles and features and not necessarily limiting or constraining the potential embodiments of the concepts described herein. For instance, a variety of different embodiments can be realized utilizing various combinations of the features and components described herein, including combinations realized through the various implementations of components described herein. Other implementations, features, and details should be appreciated from the contents of this Specification.

Although this disclosure has been described in terms of certain implementations and generally associated methods, alterations and permutations of these implementations and methods will be apparent to those skilled in the art. For example, the actions described herein can be performed in a different order than as described and still achieve the desirable results. As one example, the processes depicted in the accompanying figures do not necessarily require the particular order shown, or sequential order, to achieve the desired results. In certain implementations, multitasking and parallel processing may be advantageous. Additionally, other user interface layouts and functionality can be supported. Other variations are within the scope of the following claims.

In general, one aspect of the subject matter described in this specification can be embodied in methods and executed instructions that include or cause the actions of identifying a sample that includes software code, generating a control flow graph for each of a plurality of functions included in the sample, and identifying, in each of the functions, features corresponding to instances of a set of control flow fragment types. The identified features can be used to generate a feature set for the sample from the identified features These and other embodiments can each optionally include one or more of the following features. The features identified for each of the functions can be combined to generate a consolidated string for the sample and the feature set can be generated from the consolidated string. A string can be generated for each of the functions, each string describing the respective features identified for the function. Combining the features can include identifying a call in a particular one of the plurality of functions to another one of the plurality of functions and replacing a portion of the string of the particular function referencing the other function with contents of the string of the other function. Identifying the features can include abstracting each of the strings of the functions such that only features of the set of control flow fragment types are described in the strings. The set of control flow fragment types can include memory accesses by the function and function calls by the function. Identifying the features can include identifying instances of memory accesses by each of the functions and identifying instances of function calls by each of the functions. The feature set can identify each of the features identified for each of the functions. The feature set can be an n-graph.

Further, these and other embodiments can each optionally include one or more of the following features. The feature set can be provided for use in classifying the sample. For instance, classifying the sample can include clustering the sample with other samples based on corresponding features of the samples. Classifying the sample can further include determining a set of features relevant to a cluster of samples. Classifying the sample can also include determining whether to classify the sample as malware and/or determining whether the sample is likely one of one or more families of malware. Identifying the features can include abstracting each of the control flow graphs such that only features of the set of control flow fragment types are described in the control flow graphs. A plurality of samples can be received, including the sample. In some cases, the plurality of samples can be received from a plurality of sources. The feature set can identify a subset of features identified in the control flow graphs of the functions of the sample. The subset of features can correspond to memory accesses and function calls in the sample code.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

The following examples pertain to embodiments in accordance with this Specification. Example 1 is a display device including: a plurality of light-emitting diode (LED) devices to implement an array of pixels to illuminate and present graphical information on the display device, where the array of pixels includes a plurality of pixels, each pixel in the plurality of pixels is associated with a respective first set of LED devices to implement a first set of sub-pixels and a respective second set of LED devices to implement a redundant second set of sub-pixels for the corresponding pixel; and controller circuitry to: determine a first time window; send a first signal to cause the first sets of LED devices for the plurality of pixels to be enabled, where the first sets of LED devices are used to present the graphical information during the first time window and the sets of second LED devices are disabled during the first time window based on the first signal; determine a second time window; and send a second signal to cause the second sets of LED devices for the plurality of pixels to be enabled and the first sets of LED devices for the plurality of pixels to be disabled, where the second sets of LED devices are used to present the graphical information during the second time window based on the second signal.

Example 2 includes the subject matter of Example 1, where the controller circuitry includes a timing controller (TCON).

Example 3 includes the subject matter of Example 1, where: each one of the pixels is to include at least one of each of a red sub-pixel, a green sub-pixel, and a blue sub-pixel; the first sets of LED devices implement each of the red, green, and blue sub-pixels; and the second sets of LED devices implement fewer than all of the red, green, and blue sub-pixels.

Example 4 includes the subject matter of Example 1, further including pixel driver circuitry to alternatively drive a first set of LED devices or second set of LED devices to implement a particular one of the plurality of pixels based on the first and second signals.

Example 5 includes the subject matter of Example 1, where the first and second time windows are according to a rotation frequency to switch between use of the first sets of LED devices and the second sets of LED devices, and the rotation frequency includes an adjustable value.

Example 6 includes the subject matter of Example 1, where the controller circuitry is further to identify screen use data, the screen use data describes historical use of the plurality of pixels to display the graphical information, and the first and second time windows are based on the screen use data.

Example 7 includes the subject matter of Example 1, where each pixel in the plurality of pixels is associated with at least a third set of LED devices to implement a redundant third set of sub-pixels for the corresponding pixel.

Example 8 includes the subject matter of any one of Examples 1-7, where the LED devices in the plurality of LED devices include microLED devices.

Example 9 includes the subject matter of Example 8, where: each of the first sets of LED devices includes at least one microLED device to implement a red sub-pixel, at least one microLED device to implement a green sub-pixel, and at least one microLED device to implement a blue sub-pixel; and each of the second sets of LED devices includes at least one microLED device to implement a red sub-pixel, at least one microLED device to implement a green sub-pixel, and at least one microLED device to implement a blue sub-pixel.

Example 10 includes the subject matter of Example 9, where quantum dot conversion is applied to a blue microLED to implement the red sub-pixel in the first and second sets of LED devices.

Example 11 includes the subject matter of any one of Examples 1-7, where the LED devices in the plurality of LED devices include organic LED (OLED) devices.

Example 12 includes the subject matter of any one of Examples 1-7, where the LED devices in the plurality of LED devices include quantum LED (QLED) devices.

Example 13 is a method including: generating a first signal to enable a first set of sub-pixels for a particular pixel of a display device, where: the first set of sub-pixels include a red sub-pixel, a green sub-pixel, and a blue sub-pixel; a redundant second set of sub-pixels is also assigned to the particular pixel and the second set of sub-pixels include one or more of a red sub-pixel, a green sub-pixel, and a blue sub-pixel; the first signal enables the first set of sub-pixels, and the first set of sub-pixels is enabled for use in displaying graphics on the display device; and the second set of sub-pixels is disabled while the first set of sub-pixels is enabled. The method further includes: determining a threshold use of the first set of sub-pixels; and generating a second signal to enable the second set of sub-pixels for use in displaying graphics on the display device and disable the first set of sub-pixels based on the threshold.

Example 14 includes the subject matter of Example 13, where the first set of sub-pixels are implemented using a first set of LED devices, and the second set of sub-pixels are implemented using a different, second set of LED devices.

Example 15 includes the subject matter of Example 14, where the first and second sets of LED devices include microLED devices.

Example 16 includes the subject matter of Example 14, where the first and second sets of LED devices include OLED devices.

Example 17 includes the subject matter of Example 14, where the first and second sets of LED devices include QLED devices.

Example 18 includes the subject matter of any one of Examples 13-17, where the threshold includes a duration of time, the second signal is sent based on determining that the first set of sub-pixels have been used to present graphics for the duration of time, and the second set of sub-pixels are to remain enabled for use for the duration of time based on the second signal.

Example 19 includes the subject matter of any one of Examples 13-18, further including changing the duration of time to a different duration of time.

Example 20 includes the subject matter of any one of Examples 13-19, further including: driving the first the first set of sub-pixels, when enabled by the first signal, to cause information to presented on the display device; and driving the second set of sub-pixels, when enabled by the second signal, to cause information to presented on the display device.

Example 21 includes the subject matter of any one of Examples 13-20, where: the first set of sub-pixels includes a red sub-pixel, a green sub-pixel, and a blue sub-pixel; and the second set of sub-pixels includes a red sub-pixel, a green sub-pixel, and a blue sub-pixel.

Example 22 includes the subject matter of any one of Examples 13-21, where at least one of the first set of sub-pixels or the second set of sub-pixels is implemented using quantum dot color conversion.

Example 23 includes the subject matter of any one of Examples 13-22, where: each one of the pixels is to include at least one of each of a red sub-pixel, a green sub-pixel, and a blue sub-pixel; the first set of sub-pixels include each of the red, green, and blue sub-pixels; and the second set of sub-pixels include fewer than all of the red, green, and blue sub-pixels.

Example 24 is a system including means to perform the method of any one of Examples 13-23.

Example 25 includes the subject matter of Example 24, where the means include a timing controller.

Example 26 includes the subject matter of Example 24, where the means include the display device.

Example 27 is a system including: a processor apparatus to generate graphics information; memory; a light-emitting diode (LED) display to present the graphics information, where the LED display includes a plurality of pixels, and the LED display includes, for each of the plurality of pixels: a first set of LEDs to implement a first set of sub-pixels for the pixel, a second set of LEDs to implement a redundant second set of sub-pixels for the pixel, and circuitry to disable one or more of the second set of LEDs when the first set of LEDs is enabled and disable one or more of the first set of LEDs when the second set of LEDs is enabled; and controller circuitry to: determine a first time window to enable the first sets of LEDs; send at least one first signal to cause the first sets of LEDs to be enabled; determine a second time window to enable the second sets of LEDs; and send at least one second signal to cause the second sets of LEDs to be enabled.

Example 28 includes the subject matter of Example 27, where at least one of the first set of LEDs or the second set of LEDs utilizes quantum dot color conversion to implement at least one sub-pixel for at least one of the plurality of pixels.

Example 29 includes the subject matter of any one of Examples 27-28, where the redundant second set of sub-pixels includes a redundant sub-pixel of the first set of sub-pixels and omits at least one of the sub-pixels of the first set of sub-pixels.

Example 30 includes the subject matter of Example 29, where the first set of sub-pixels includes a red sub-pixel, a green sub-pixel, and a blue sub-pixel.

Example 31 includes the subject matter of any one of Examples 27-30, further including driver circuitry associated with at least a particular one of the plurality of pixels, where the driver circuitry is to alternatively drive either the first set of LEDs of the particular pixel or the second set of LEDs of the particular pixel based on the first and second signals.

Example 32 includes the subject matter of any one of Examples 27-31, where the system includes one of a notebook computer, a handheld computer, a smart television, or a computer display monitor.

Example 33 includes the subject matter of any one of Examples 27-32, where the first and second sets of LEDs include microLEDs.

Example 34 includes the subject matter of any one of Examples 27-32, where the first and second sets of LEDs include OLEDs.

Example 35 includes the subject matter of any one of Examples 27-32, where the first and second sets of LEDs include QLEDs.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results.

What is claimed is:

1. A display device comprising:
a plurality of light-emitting diode (LED) devices to implement an array of pixels to illuminate and present graphical information on the display device, wherein the array of pixels comprises a plurality of pixels, at least one particular pixel in the plurality of pixels comprises a plurality of sub-pixels, a first subset of LED devices in the plurality of LED devices implements the plurality of sub-pixels for the particular pixel, the first subset of LED devices comprises: a first LED device to implement a first color, a second LED device to also implement the first color, and a third LED device to implement a different second color;
scan line data circuitry to provide scan line data to the particular pixel and identify a color state to be applied through activation of a corresponding set of one or more of the plurality of sub-pixels at the particular pixel;
driver circuitry to drive the first subset of LED devices; and
controller circuitry to:
determine a first time window;
send a first signal to allow the driver circuitry to drive the first LED device to implement a first sub-pixel in the plurality of pixels for the particular pixel during the first time window when the first sub-pixel is activated based on the scan line data, wherein driving of the second LED device is blocked from implementing the first sub-pixel when the first sub-pixel is activated during the first time window based on the first signal;
determine a second time window; and
send a second signal to allow the driver circuitry to drive the second LED device to implement the first sub-pixel for the particular pixel instead of the first LED device during the second time window when the first sub-pixel is activated based on the scan line data, wherein driving of the first LED device is blocked from implementing the first sub-pixel when the first sub-pixel is activated during the second time window based on the second signal.

2. The display device of claim 1, wherein the controller circuitry comprises a timing controller (TCON).

3. The display device of claim 1, wherein each LED device in the first subset of LED devices comprises a respective microLED device.

4. The display device of claim 1, wherein:
the first and second LED devices each implement redundant copies of a red sub-pixel for the particular pixel, the third LED device implements a green-subpixel for the particular pixel, and the first subset of pixels further comprises a fourth LED device to implement a redundant copy of the green subpixel for the particular pixel, and fifth and sixth LED devices to implement redundant copies of a blue subpixel for the particular pixel.

5. The display device of claim 4, wherein quantum dot conversion is applied to at least one of the first or second LED device to implement the red sub-pixel.

6. The display device of claim 1, wherein:
the first subset of the plurality of LED devices implement redundant sub-pixels for at fewer than all of a red sub-pixel, a green sub-pixel, and a blue sub-pixel for the particular pixel.

7. The display device of claim 1, wherein the first and second time windows are according to a rotation frequency to switch between use of the first LED device and the second LED device to implement the first sub-pixel for the particular pixel, and the rotation frequency comprises an adjustable value.

8. The display device of claim 1, wherein the controller circuitry is further to identify screen use data, the screen use data describes historical use of the plurality of pixels to display the graphical information, and the first and second time windows are based on the screen use data.

9. The display device of claim 1, wherein the first subset of LED devices further comprises a fourth LED device of the first color to also selectively implement the first sub-pixel for the corresponding particular pixel.

10. A method comprising:
receiving scan line data for a display device, wherein the display device comprises a plurality of light-emitting diode (LED) devices to implement an array of pixels to illuminate and present graphical information on the display device based on the scanline data, wherein the array of pixels comprises a plurality of pixels, at least one particular pixel in the plurality of pixels comprises a respective plurality of sub-pixels, a first subset of LED devices in the plurality of LED devices implements the plurality of sub- pixels for the particular pixel, and the first subset of LED devices comprises: a first LED device to implement a first color, a second LED device to also implement the first color, and a third LED device to implement a different second color, wherein the display device further comprises driver circuitryto drive the first subset of LED devices;
applying a first signal at the display device to allow the driver circuitry to drive the first LED device to implement a first sub-pixel in the plurality of sub-pixels for the particular pixel when the first sub-pixel is activated based on the scan line data, wherein the second LED device is blocked from implementing the first sub-pixel while the first signal is applied;
determining a threshold use of the first LED device; and
applying a second signal based on the threshold, wherein applying the second signal allows the driver circuitry to drive the second LED device to implement the first sub-pixel when the first sub-pixel is activated based on the scan line data, wherein the first LED device is blocked from implementing the first sub-pixel while the second signal is applied.

11. The method of claim 10, wherein the threshold comprises a duration of time, the second signal is applied based on determining that the first LED has been used to present graphics for the duration of time.

12. The method of claim 11, further comprising changing the duration of time to a different duration of time.

13. A system comprising:
a processor apparatus to generate graphics information;
memory;
a micro light emitting diode (microLED) display to present the graphics information, wherein the microLED display comprises:
a plurality of microLEDs to implement a plurality of pixels of the microLED display, at least one particular pixel in the plurality of pixels comprises a plurality of sub-pixels, a first subset of microLED devices in the plurality of microLED devices implements the plurality of sub-pixels for the particular pixel, the first subset of LED devices comprises: a first microLED device to implement a first color, a second microLED device to also implement the first color, and a third microLED device to implement a different second color;
scan line data circuitry to provide scan line data to the particular pixel and identify a color state to be applied through activation of a corresponding set of one or more of the plurality of sub-pixels at the particular pixel; and
driver circuitry to drive the first subset of microLED devices; and
controller circuitry to:
determine a first time window;
send at least one first signal to allow the driver circuitry to drive the first microLED to implement a first sub-pixel in the plurality of pixels for the particular pixel during the first time window when the first sub-pixel is activated based on the scan line data, wherein the second microLED is blocked from implementing the first sub-pixel when the first sub-pixel is activated during the first time window based on the first signal;
determine a second time window; and
send at least one second signal to allow the driver circuitry to drive the second microLED to implement the first sub-pixel for the particular pixel instead of the first microLED during the second time window when the first sub-pixel is activated based on the scan line data, wherein driving of the first microLED device is blocked from implementing the first sub-pixel when the first sub-pixel is activated during the second time window based on the second signal.

14. The system of claim 13, wherein at least one microLED in the first subset of microLEDs utilizes quantum dot color conversion to implement at least one sub-pixel for the particular pixel.

15. The system of claim 13, wherein the third microLED is the only microLED provided in the plurality of microLEDs to implement the second sub-pixel for the particular pixel.

16. The system of claim 13, wherein the plurality of sub-pixels comprises a red sub-pixel, a green sub-pixel, and a blue sub-pixel.

17. The system of claim 13, wherein the system comprises one of a smart television or a computer display monitor.

18. The system of claim 13, wherein the system comprises one of a notebook computer or a handheld computer.

* * * * *